United States Patent
Iversen et al.

(10) Patent No.: US 9,064,958 B1
(45) Date of Patent: Jun. 23, 2015

(54) MULTIPLE GATE TRANSISTOR ARCHITECTURE PROVIDING AN ACCESSIBLE INNER SOURCE-DRAIN NODE

(75) Inventors: Christian Rye Iversen, Vestbjerg (DK); Jason Yuxin Li, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1006 days.

(21) Appl. No.: 13/156,016

(22) Filed: Jun. 8, 2011

Related U.S. Application Data

(62) Division of application No. 11/744,536, filed on May 4, 2007, now Pat. No. 7,982,243.

(60) Provisional application No. 60/798,226, filed on May 5, 2006.

(51) Int. Cl.
| | | |
|---|---|---|
| H01L 27/10 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/812 | (2006.01) | |
| H01L 29/78 | (2006.01) | |

(52) U.S. Cl.
CPC ........ *H01L 29/7831* (2013.01); *H01L 29/8124* (2013.01)

(58) Field of Classification Search
CPC .................. H01L 29/7831; H01L 29/8124
USPC ................. 257/192–195, 202–206, 368–369, 257/E29.246
See application file for complete search history.

(56) References Cited

U.S. PATENT DOCUMENTS

| | | | |
|---|---|---|---|
| 6,218,890 B1 | 4/2001 | Yamaguchi et al. | |
| 6,730,953 B2 | 5/2004 | Brindle et al. | |
| 6,803,680 B2 | 10/2004 | Brindle et al. | |
| 6,882,210 B2 | 4/2005 | Asano et al. | |
| 6,891,909 B2 | 5/2005 | Hurley et al. | |
| 6,900,711 B2 | 5/2005 | Vice | |
| 6,903,656 B1 | 6/2005 | Lee | |
| 7,106,121 B2 | 9/2006 | Hidaka et al. | |
| 7,199,635 B2 | 4/2007 | Nakatsuka et al. | |
| 7,459,988 B1 | 12/2008 | Iversen | |
| 2007/0228424 A1 | 10/2007 | Igarashi | |

OTHER PUBLICATIONS

Non-final Office Action for U.S. Appl. No. 11/744,536 mailed Jun. 23, 2010, 7 pages.
Notice of Allowance for U.S. Appl. No. 11/532,725 mailed Jul. 29, 2008, 6 pages.
Notice of Allowance for U.S. Appl. No. 11/744,536 mailed Dec. 3, 2010, 6 pages.
Notice of Allowance for U.S. Appl. No. 11/744,536 mailed Mar. 10, 2011, 10 pages.

*Primary Examiner* — Cuong Q Nguyen
(74) *Attorney, Agent, or Firm* — Withrow & Terranova, P.L.L.C.

(57) ABSTRACT

The present invention provides a multiple gate transistor architecture that provides an accessible inner source-drain (SD) node. The transistor architecture includes a source structure having multiple source fingers, which extend from a source bus, and a drain structure having multiple drain fingers, which extend from a drain bus. The fingers of the respective source and drain structures are interleaved wherein a meandering path is formed between the source and drain structures. Two or more gate structures run substantially parallel to one another along the meandering path between the source and drain structures. An SD structure is provided between each adjacent pair of gate structures and runs along the meandering path to form the SD node. An SD extension is coupled to the SD structure and accessible by other circuitry to allow a signal to be applied to the SD structure during operation.

17 Claims, 46 Drawing Sheets

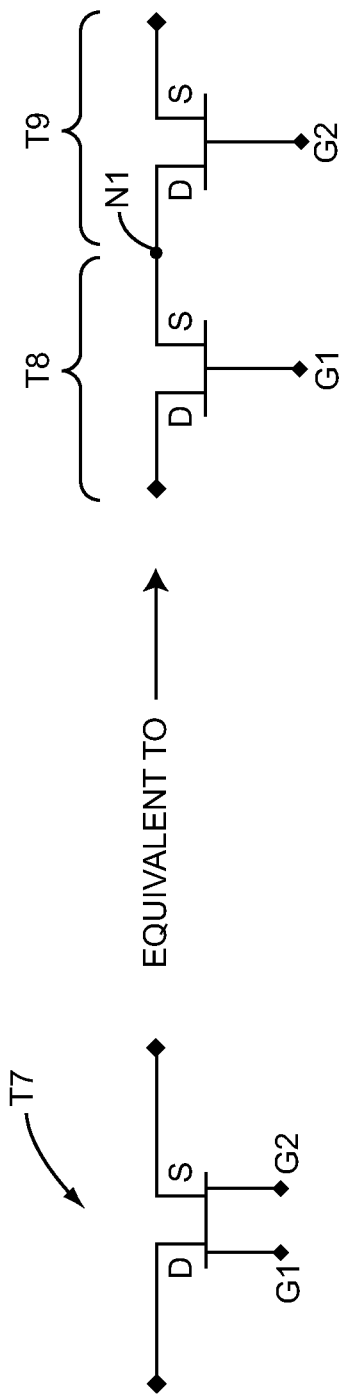
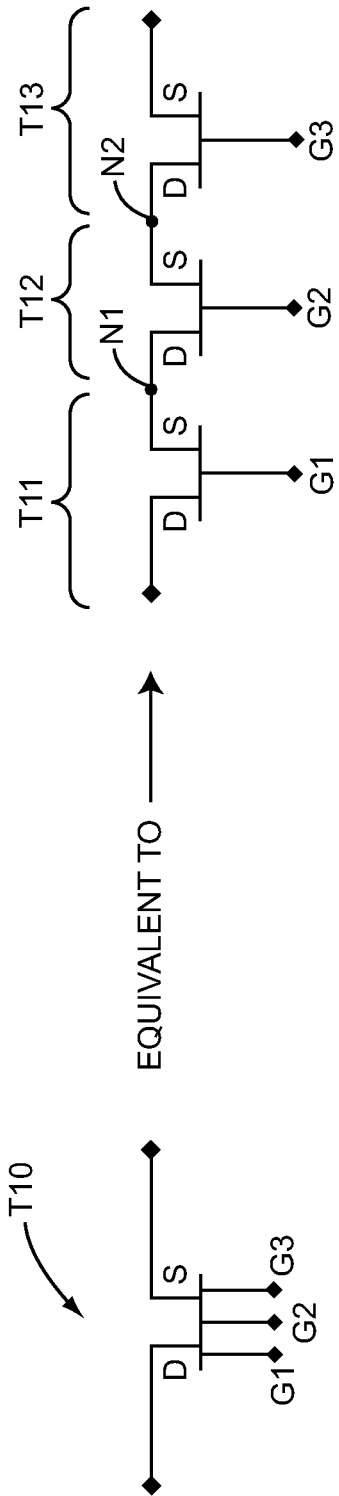
FIG. 2A
FIG. 2B

MULTIPLE GATE TRANSISTOR ARCHITECTURE PROVIDING AN ACCESSIBLE INNER SOURCE-DRAIN NODE

CROSS-REFERENCE TO RELATED APPLICATIONS

This application is a Divisional of U.S. patent application Ser. No. 11/744,536 filed May 4, 2007, now U.S. Pat. No. 7,982,243, which claims the benefit of U.S. Provisional Patent Application No. 60/798,226, filed May 5, 2006, the disclosures of which are incorporated herein by reference in their entireties. This application is related to U.S. patent application Ser. No. 11/532,725, filed Sep. 18, 2006, now U.S. Pat. No. 7,459,988, the disclosure of which is incorporated herein by reference in its entirety.

FIELD OF THE INVENTION

The present invention relates to multiple gate transistor architectures, and in particular to providing a multiple gate transistor architecture that provides access to an inner source-drain node.

BACKGROUND OF THE INVENTION

Field Effect Transistors (FETs) of various types are widely used in analog and digital electronics to provide various switching and amplification functions. FETs are a type of transistor that relies on an electric field to control the conductivity of a channel that is formed in a semiconductor material. In particular, a typical FET will include gate, source, and drain nodes, wherein application of a voltage to the gate node will control the flow of current between the source and drain nodes.

In certain applications, FETs are connected in series, where the source of one transistor is connected to the drain of another. One such application has been set forth in commonly assigned U.S. patent application Ser. No. 11/532,725 filed Sep. 18, 2006, entitled HIGH LINEARITY WIDE DYNAMIC RANGE RADIO FREQUENCY ANTENNA SWITCH, now U.S. Pat. No. 7,459,988, which is incorporated herein by reference in its entirety. Without delving into the details of operation of the antenna switch, an antenna switch as provided in the above-referenced application is illustrated in FIG. 1. In general, the antenna switch provides a wide dynamic range of operation and includes multiple FETs T1-T6, which are connected in series. A control input, VCONTROL, is provided to enable or disable the antenna switch. The control input VCONTROL is distributed to the gates G of each of the FETs T1-T6 via resistors R0-R6.

As noted, the FETs T1-T6 are coupled in series between two input/output ports (I/O). As illustrated, the drain D of FET T1 is coupled to a first input/output port I/O, while the source S of FET T1 is coupled to a drain D of FET T2 at node N1. Similarly, the source S of FET T2 is coupled to a drain D of FET T3 at node N2; the source S of FET T3 is coupled to the drain D of FET T4 at node N3; the source S of FET T4 is coupled to the drain D of FET T5 at node N4; and the source S of FET T5 is coupled to the drain D of FET T6 at node N5. The source S of FET T6 is coupled to the second input/output port I/O.

Capacitors C1 and C2 provide self-biasing of the switch branch under large signal conditions, and thereby improve linearity. Notably, each of the nodes N1-N5 is coupled to a bias network made of resistors R7-R14. In operation, direct current (DC) bias signals are provided to each of these nodes N1-N6 to ensure that when the antenna switch is disabled, the input impedance presented to the input/output ports (I/O) remains stable.

Although the above design performs well, it is not space efficient. In particular, having to lay out six different FETs T1-T6 and provide access to the respective nodes N1-N5 for biasing when the antenna switch is disabled takes up a significant amount of space on the semiconductor module in which the antenna switch is implemented.

In certain applications, multiple-gate FETs can be used in place of multiple FETs that are connected in series. With reference to FIG. 2A, a dual-gate FET T7 has a drain D, source S, a first gate G1, and a second gate G2. This dual-gate configuration is equivalent to two single-gate FETs T8 and T9 connected in series. The FET T8 will include a single gate G1, a drain D and a source S. The FET T9 will include a single gate G2, a drain D, and a source S. The source S of FET T8 is coupled to the drain D of FET T9 at node N1. Notably, if node N1 needs to be connected to related circuitry, the dual-gate FET T7 may not be a substitute, as node N1 is generally not available or accessible.

As another example, the triple-gate FET T10 of FIG. 2B will include three gates, G1, G2, and G3, along with a drain D and a source S. This configuration is equivalent to three FETs T11-T13 connected in series. Each of the FETs T11-T13 will include a respective one of the gates G1-G3 and a corresponding drain D and source S. The source S of FET T11 is coupled to the drain D of FET T12 at node N1, and the source S of FET T12 is coupled to the drain D of FET T13 at node N2. Again, in an application where nodes N1 and N2 require bias, the equivalent triple-gate FET T10 is generally not available.

As such, if multiple-gate FETs are used to reduce the number of individual transistors in the antenna switch of FIG. 1, the biasing that is provided to the nodes N1-N5 would not be available. As illustrated in FIG. 3, the six FETs T1-T6 are replaced with two triple-gate FETs T14 and T15. Each of the FETs T14 and T15 will include three gates G1, G2, and G3, which are connected to the control network R0-R6. The drain D of FET T14 is coupled to the first input/output port I/O, while the source S of FET T15 is coupled to the second input/output port I/O. The source S of FET T14 is coupled to the drain D of FET T15 at node N1. However, node N1 may not be biased because there is no ability to provide the distributed bias as provided in FIG. 1 due to the inaccessibility of actual or virtual source-drain connections or nodes within the multiple-gate FET architectures. R15 provides a resistive path between the respective input/output ports I/O.

FIGS. 4-6 provide high level overviews of a typical cross-section of three different FET architectures. FIG. 4 depicts a dual-gate pseudomorphic high-electron mobility transistor (pHEMT), FIG. 5 depicts a dual-gate metal oxide semiconductor field-effect transistor (MOSFET), and FIG. 6 illustrates a dual-gate metal semiconductor field-effect transistor (MESFET).

With particular reference to FIG. 4, the transistor structure 10 for a dual-gate pHEMT will include a source 12, drain 14, first gate 16, second gate 18, and an inner source-drain (SD) node 20. The first and second gates 16, 18 are located between the source 12 and the drain 14. The inner SD node 20 has a similar semiconductor structure as that of the source 12 and drain 14, and is located between the first gate 16 and the second gate 18. The various transistor elements are generally formed on a given substrate 22. In this example, an indium gallium arsenide (InGaAs) channel layer 24 resides on the substrate 22, and an aluminum gallium arsenide (AlGaAs) schottky layer 26 resides on the InGaAs channel layer 24. To form the source 12, an etch stop material is formed over a source area, and a gallium arsenide (GaAs) cap section 30 that is heavily doped (N+) with N-type material is provided over the etch stop section 28. A source ohmic metal contact 32 is provided over the GaAs cap layer 30 to facilitate electrical connection to the source 12. The drain 14 is formed in a similar fashion. An etch stop section 34 is left over the drain area, and a GaAs cap section 36 that is heavily doped (N+) with N-type material is provided over the etch stop section 34. A drain ohmic metal 38 is provided over all or a portion of the GaAs cap section 36 to facilitate electrical connection to the drain 14.

The inner SD node 20, from a semiconducting perspective, looks the same or similar to the source 12 and drain 14, with the exception of the source ohmic metal 32 and the drain ohmic metal 38. As such, the inner SD node 20 may include an etch stop section 40 over an area forming the inner SD node 20, where a corresponding GaAs cap section 42 that is heavily doped (N+) with N-type material is formed over the etch stop section 40. There is no ohmic metal layer on top of the GaAs cap section 42 of the inner SD node 20. A first gate metal section 44 is applied on the schottky layer 26 between the source 12 and the inner SD node 20 to form the first gate 16. Similarly, a second gate metal section 46 is applied on the schottky layer 26 between the inner SD node 20 and the drain 14 to form the second gate 18. A dielectric or passivation layer 48 may be applied over most or all of the transistor architecture, with the exception of a portion of the source ohmic metal 32 and a portion of the drain ohmic metal 38 to finalize fabrication.

Turning to FIG. 5, a transistor structure 10 of a dual-gate MOSFET is provided. The basic structure is the same as that of the pHEMT of FIG. 4, with the exception that a first gate insulator 50 is used to insulate the first gate metal section 44 from the schottky layer 26, and a second gate insulator 52 is used to insulate the second gate metal 46 from the schottky layer 26. The source 12, drain 14, and inner SD node 20 are configured in a similar fashion to the pHEMT of FIG. 4.

With reference to FIG. 6, the transistor structure 10 of a dual-gate MESFET is provided. The dual-gate MESFET is formed in a semi-insulating GaAs substrate 22. Different sections of the substrate 22 are either heavily doped (N+) or lightly doped (N−) with N-type material to form the various parts of the dual-gate MESFET. In particular, a heavily-doped (N+) GaAs section 54 forms the source 12, wherein the source ohmic metal 32 resides on the GaAs portion 54. Moving left to right, a lightly doped (N−) GaAs portion 56 resides under the first gate metal section 44, which forms the first gate 16. A heavily doped (N+) GaAs portion 58 forms the inner SD node 20. Another lightly doped (N−) GaAs portion 60 resides under the second gate metal section 46, which forms the second gate 18. Finally, another heavily doped (N+) GaAs portion 62 forms the drain 14. The drain ohmic metal 38 resides on the GaAs portion 62.

In each of these transistor structures 10 of FIGS. 4-6, the inner SD node 20 is raised above the level of the immediately surrounding substrate 22, which is defined herein to include a base substrate and any of the epitaxial layers residing thereon that are doped or otherwise manipulated to form a transistor. In many applications, the gate structures, such as the first gate 16 and the second gate 18, are elongated, and therefore the inner SD node 20 may also be elongated and may run between the adjacent gate structures. As such, there will be elongated recesses between each edge of the inner SD node 20 and an adjacent gate structure.

To increase the effective source and drain areas 12, 14 to increase power handling while minimizing the space required to implement a particular transistor architecture 10, meandering transistor architectures have been developed. One such configuration is illustrated in FIG. 7, wherein a fingered source structure 64 is interleaved with a fingered drain structure 66. Each of the respective source and drain structures 64, 66 will include a bus portion from which multiple fingers extend. The fingers of the fingered source structure 64 are interleaved with the fingers of the fingered drain structure 66 to create a meandering path therebetween. To form a dual-gate transistor structure such as that shown in FIG. 7, first and second meandering gate structures 68, 70 extend along the meandering path formed between the fingered source structure 64 and the fingered drain structure 66. The first and second meandering gate structures 68, 70 are substantially parallel to one another along the meandering path. The first and second meandering gate structures 68, 70 are generally configured not to make contact with each other or with any portion of the fingered source structure 64 or fingered drain structure 66. The first and second meandering gate structures 68, 70 may extend outside of the fingered source and drain structures 64, 66 to corresponding first and second gate contacts 72, 74.

Depending on the fabrication process, a segmented SD structure 75 may be formed along the meandering path between the fingered source and drain structures 64 and 66, and in particular, between the first and second meandering gate structures 68 and 70. Unfortunately, existing designs do not provide access to the segments of the SD structure 75 in a meandering transistor architecture. Thus, applications such as the antenna switch illustrated in FIG. 1 are not able to take advantage of the space efficiencies provided by multiple-gate transistor architectures, because the segmented SD structure 75 is not accessible for biasing.

Accordingly, there is a need for a multiple-gate transistor that has a meandering transistor architecture, where the meandering SD structure that resides between adjacent meandering gate structures is electrically accessible by associated circuitry.

SUMMARY OF THE INVENTION

The present invention provides a multiple gate transistor architecture that provides an accessible inner source-drain (SD) node such that a bias or like signal can be supplied to the inner SD node. In particular, the transistor architecture includes a source structure having multiple source fingers, which extend from a source bus, and a drain structure having multiple drain fingers, which extend from a drain bus. The fingers of the respective source and drain structures are interleaved wherein a meandering path is formed between the source and drain structures. Two or more gate structures run substantially parallel to one another along the meandering path between the source and drain structures. An SD structure is provided between each adjacent pair of gate structures and runs along the meandering path to form the SD node. Each SD structure will include or be coupled to an SD extension that is electrically coupled to the SD structure and accessible by other circuitry to allow a signal from associated circuitry to be applied to the SD structure during operation. Each of the gate, drain, source, and SD structures may be coupled to respective contacts to facilitate electrical connections to the associated circuitry.

The SD structures between any pair of gate structures may be continuous or segmented along the meandering path between the source and drain structures. For a continuous SD structure, the associated SD connector may be at one or both ends of the continuous SD structure or anywhere along the SD structure. For a segmented SD structure, SD connectors are provided for each segment. Whether continuous or segmented, the SD structure will preferably run along a significant majority of the meandering path between an associated pair of gate structures.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 2A and 2B illustrate multiple gate transistors and their series connected transistor equivalents.

Figure 11A:
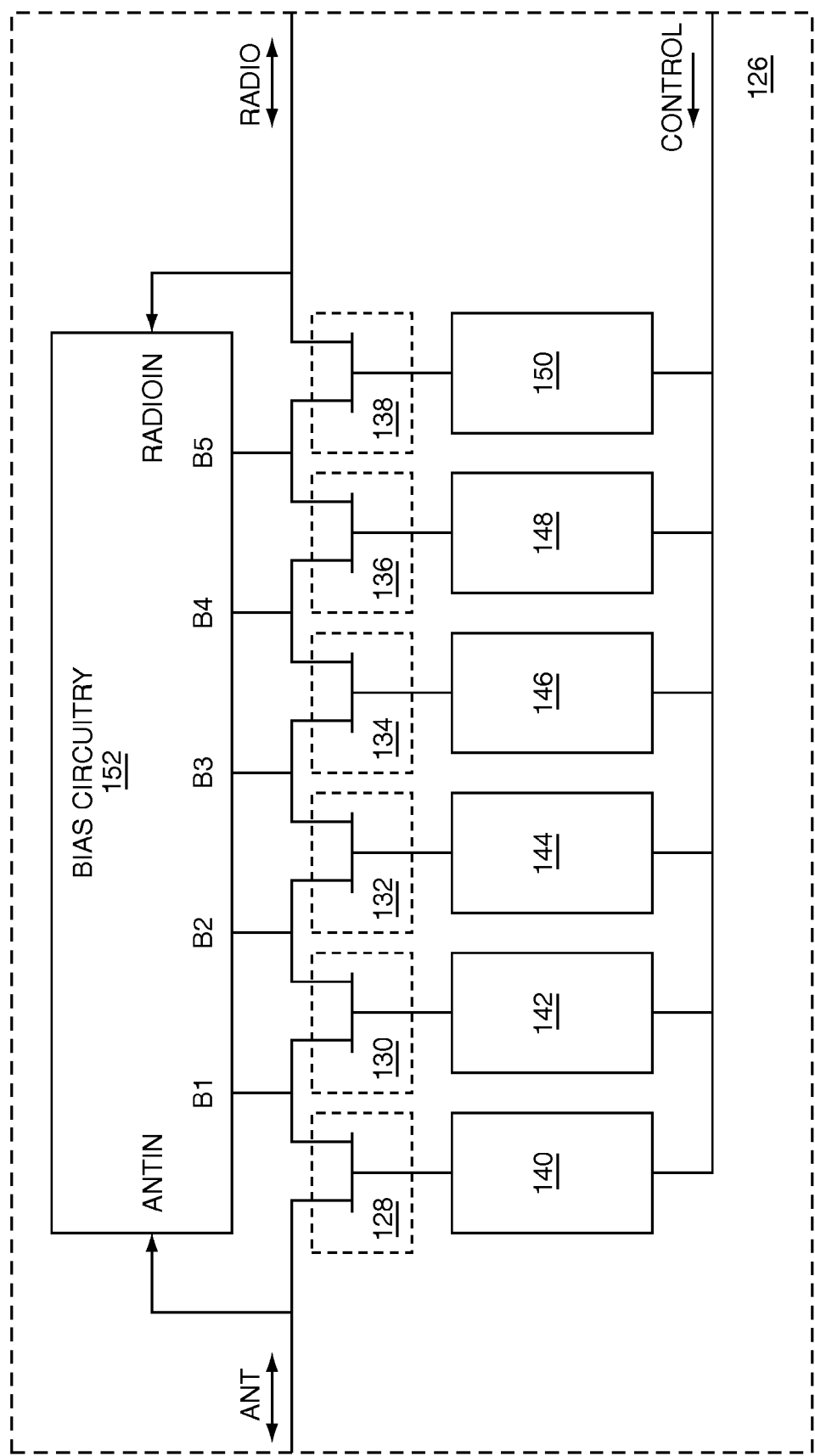
FIG. 11A is a wide dynamic range RF antenna switch with bias circuitry receiving an input signal from an antenna connection node and a radio connection node.
Figure 11B:
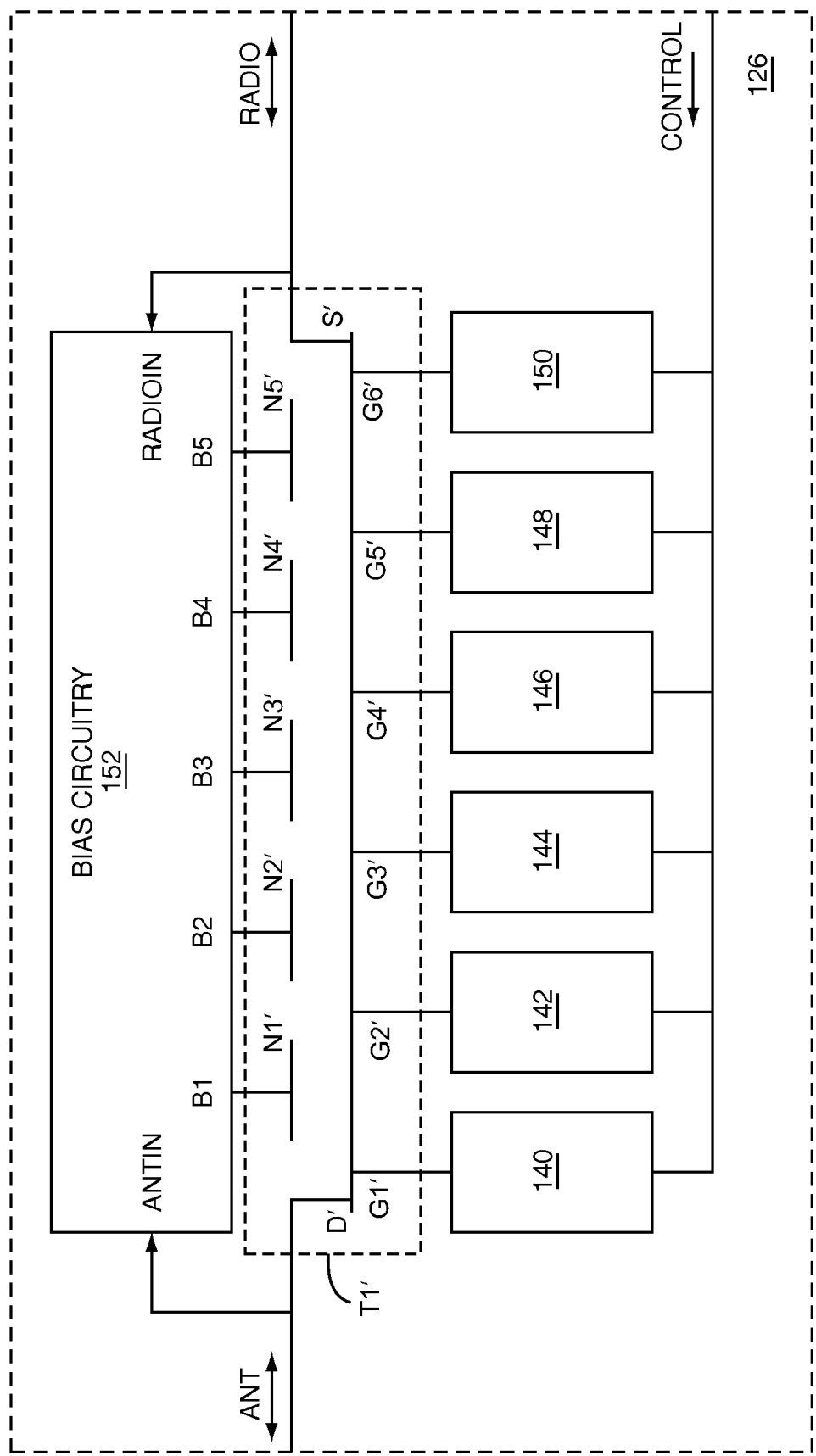

FIG. 11B modifies the embodiment of 11A with a multiple gate transistor configuration that provides an accessible source-drain node.

Figure 12A:
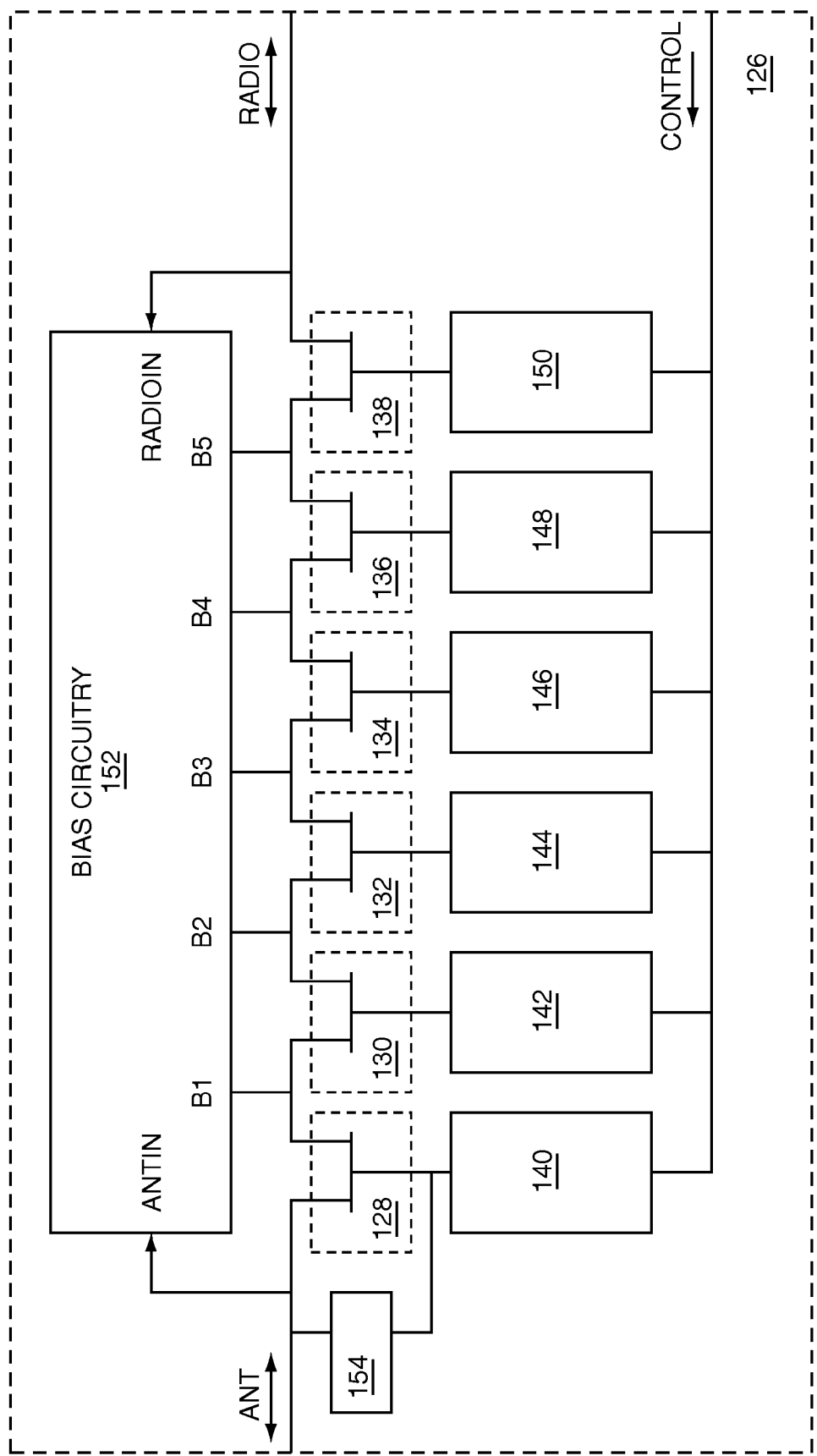

FIG. 12A adds a self-biasing network to the antenna side of the wide dynamic range RF antenna switch of FIG. 11A.

Figure 12B:
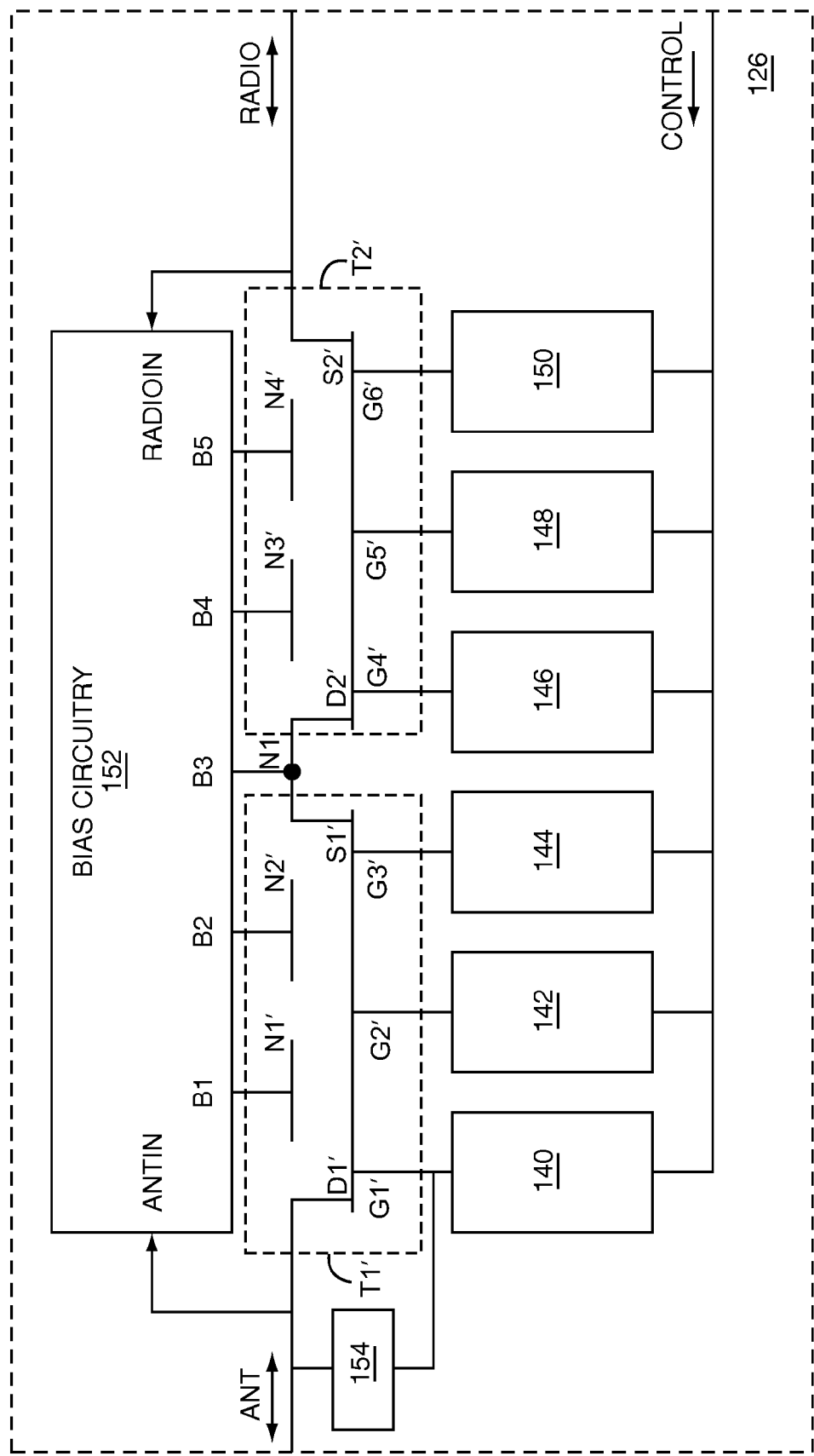

FIG. 12B modifies the embodiment of 12A with a multiple gate transistor configuration that provides an accessible source-drain node.

Figure 13A:
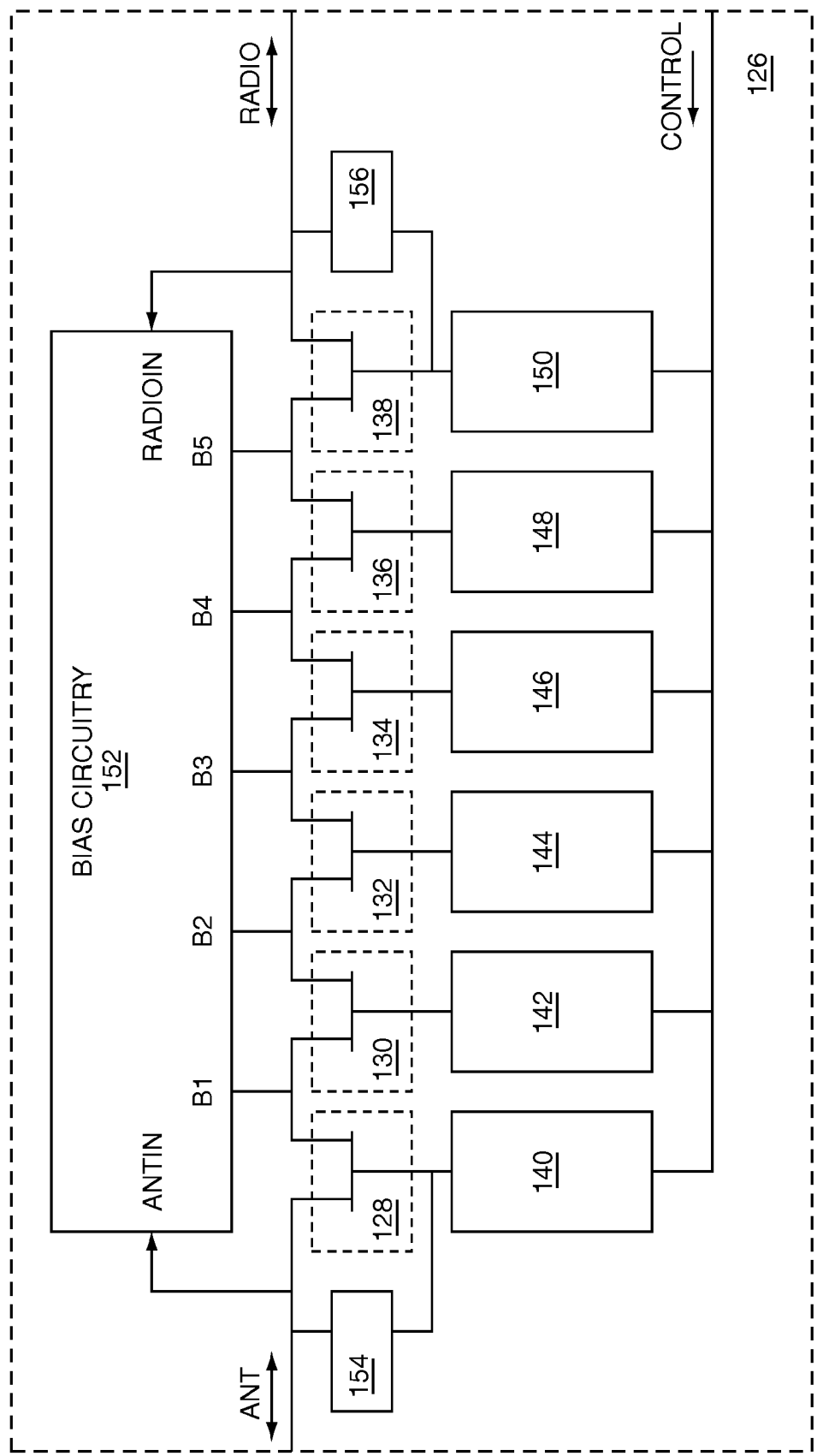

FIG. 13A adds a self-biasing network to the radio side of the wide dynamic range RF antenna switch of FIG. 12A.

Figure 13B:
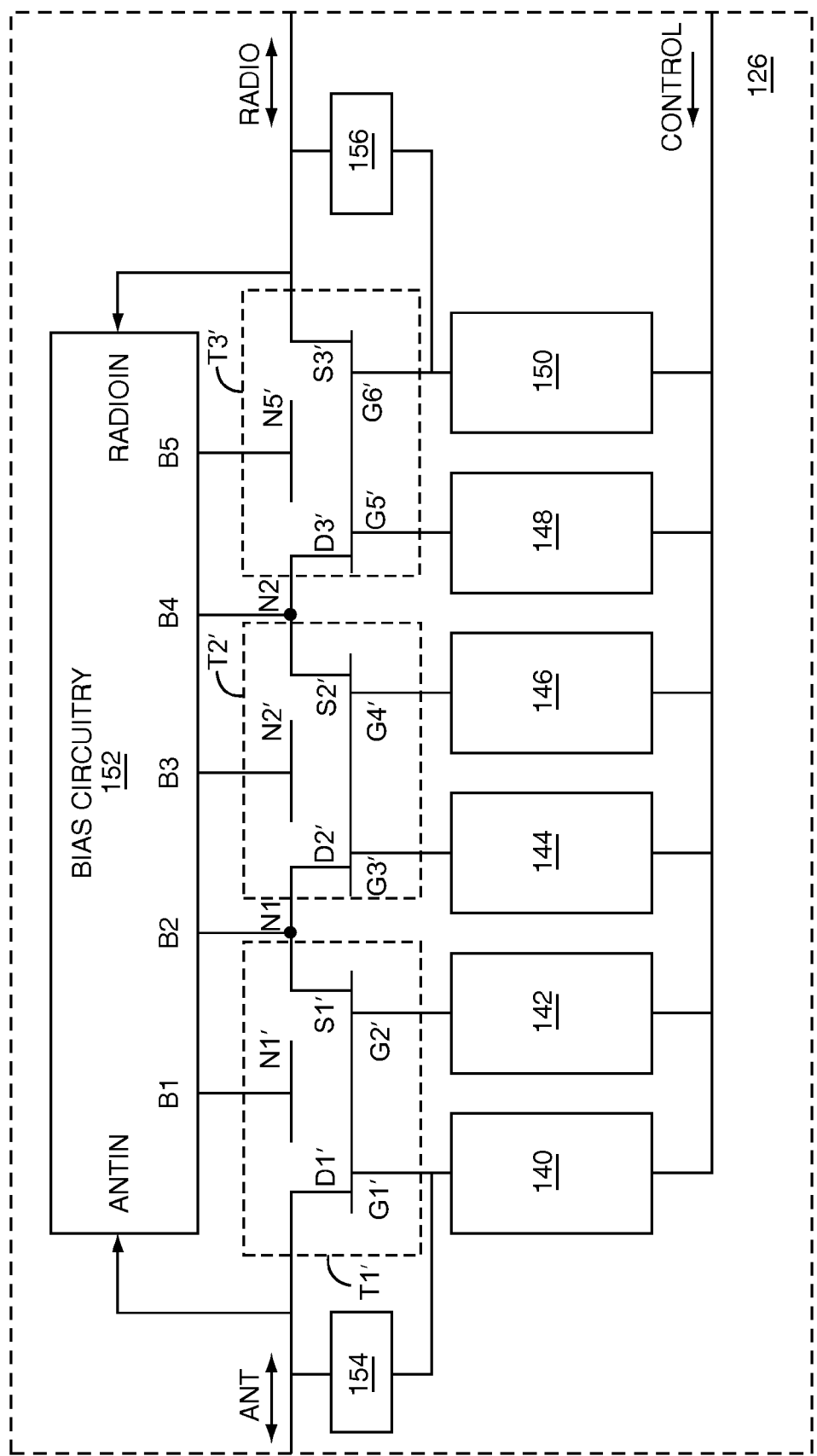

FIG. 13B modifies the embodiment of 13A with a multiple gate transistor configuration that provides an accessible source-drain node.

Figure 14A:
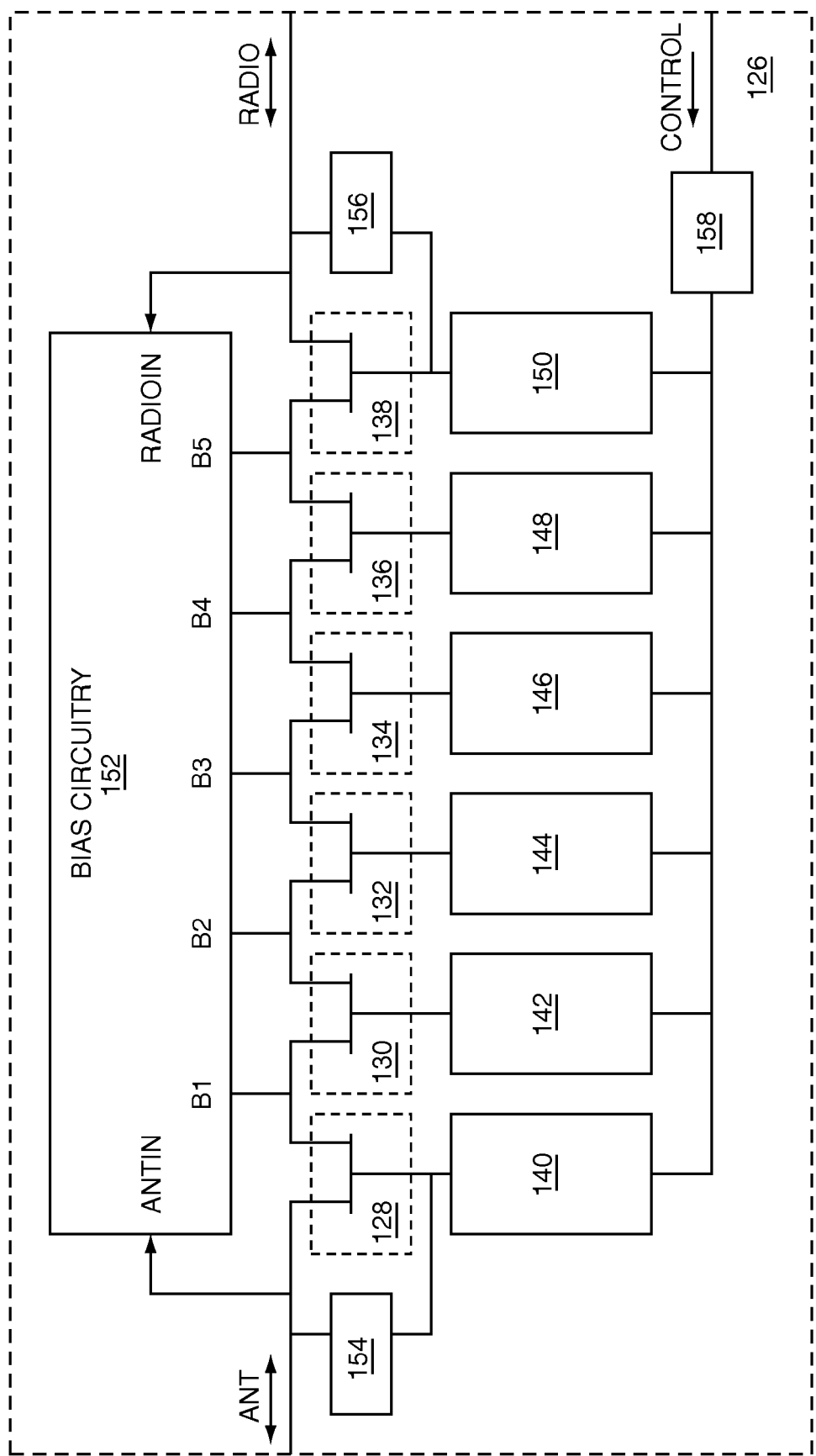

FIG. 14A adds a common control network to the wide dynamic range RF antenna switch of FIG. 13A.

Figure 14B:
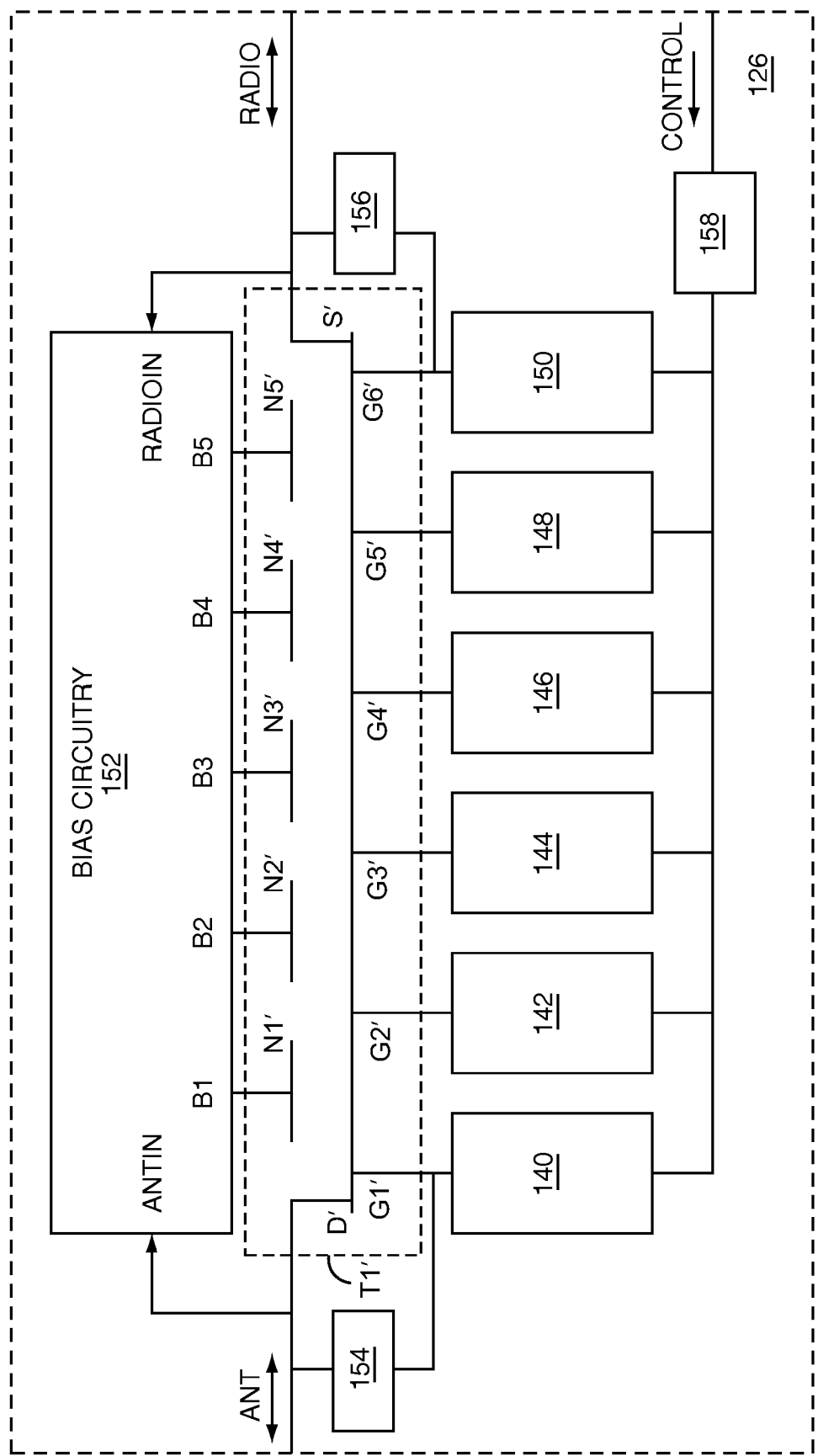

FIG. 14B modifies the embodiment of 14A with a multiple gate transistor configuration that provides an accessible source-drain node.

Figure 15A:
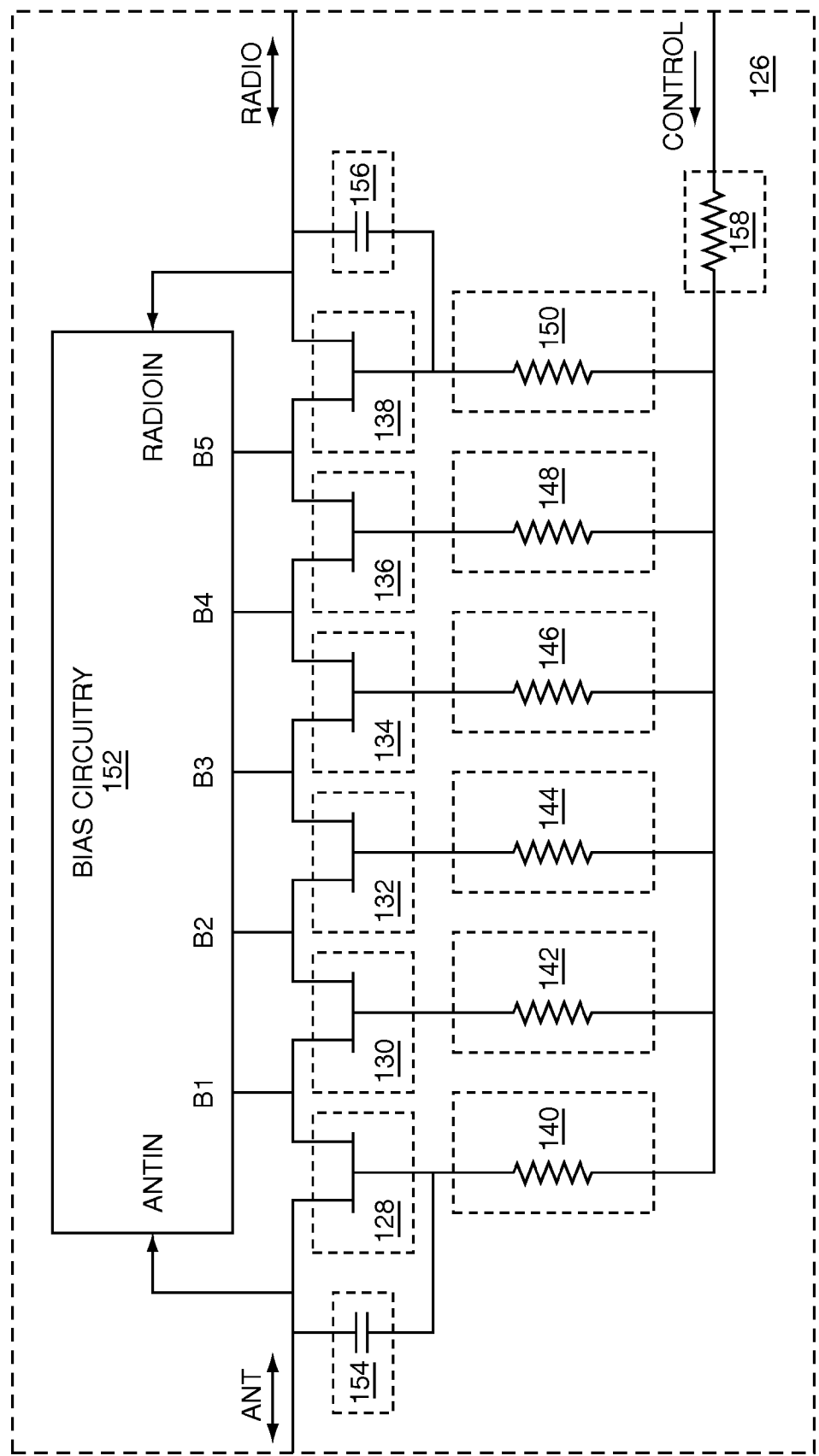

FIG. 15A shows details of the wide dynamic range RF antenna switch of FIG. 14A.

Figure 15B:
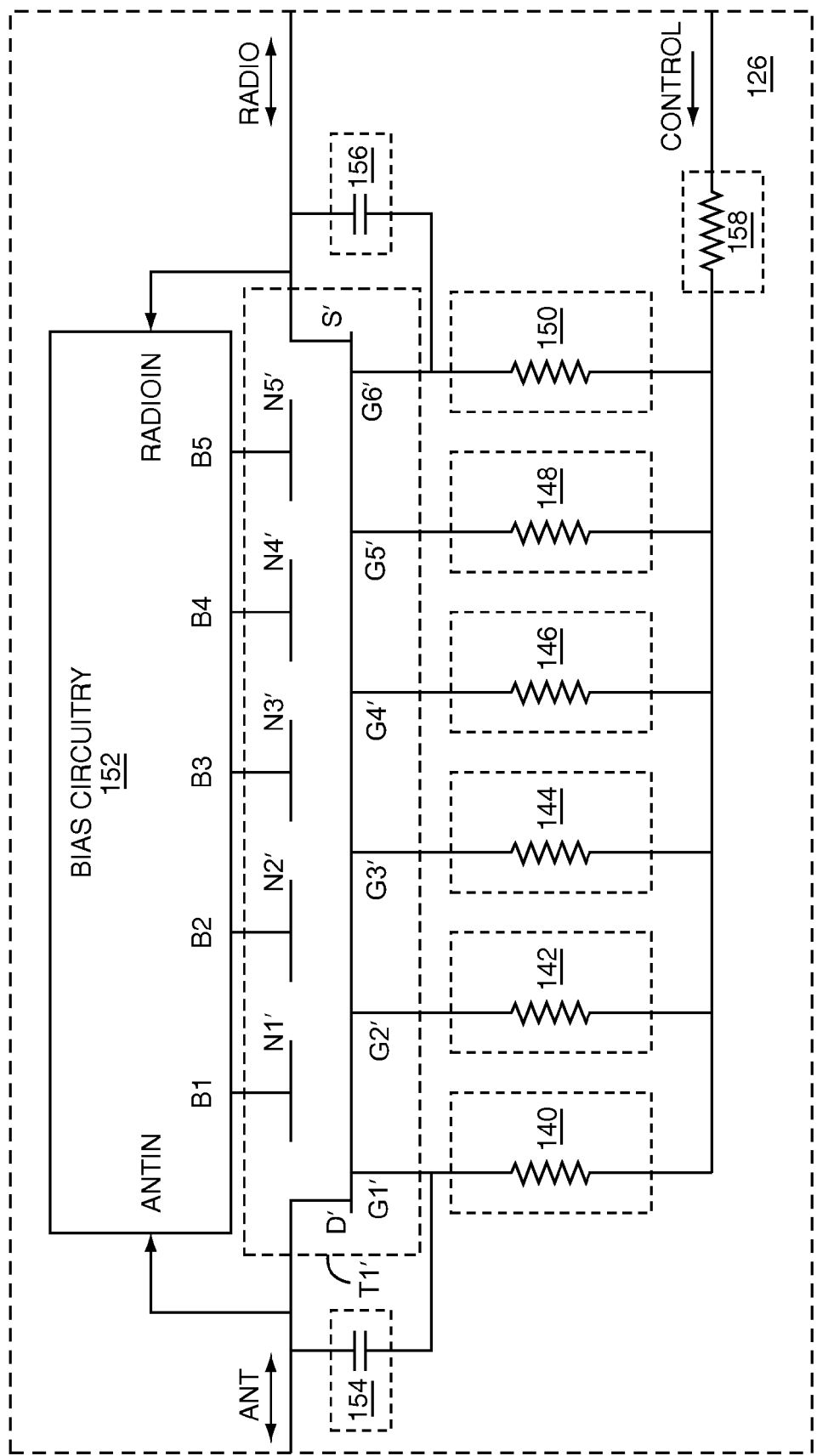

FIG. 15B modifies the embodiment of 15A with a multiple gate transistor configuration that provides an accessible source-drain node.

Figure 16A:
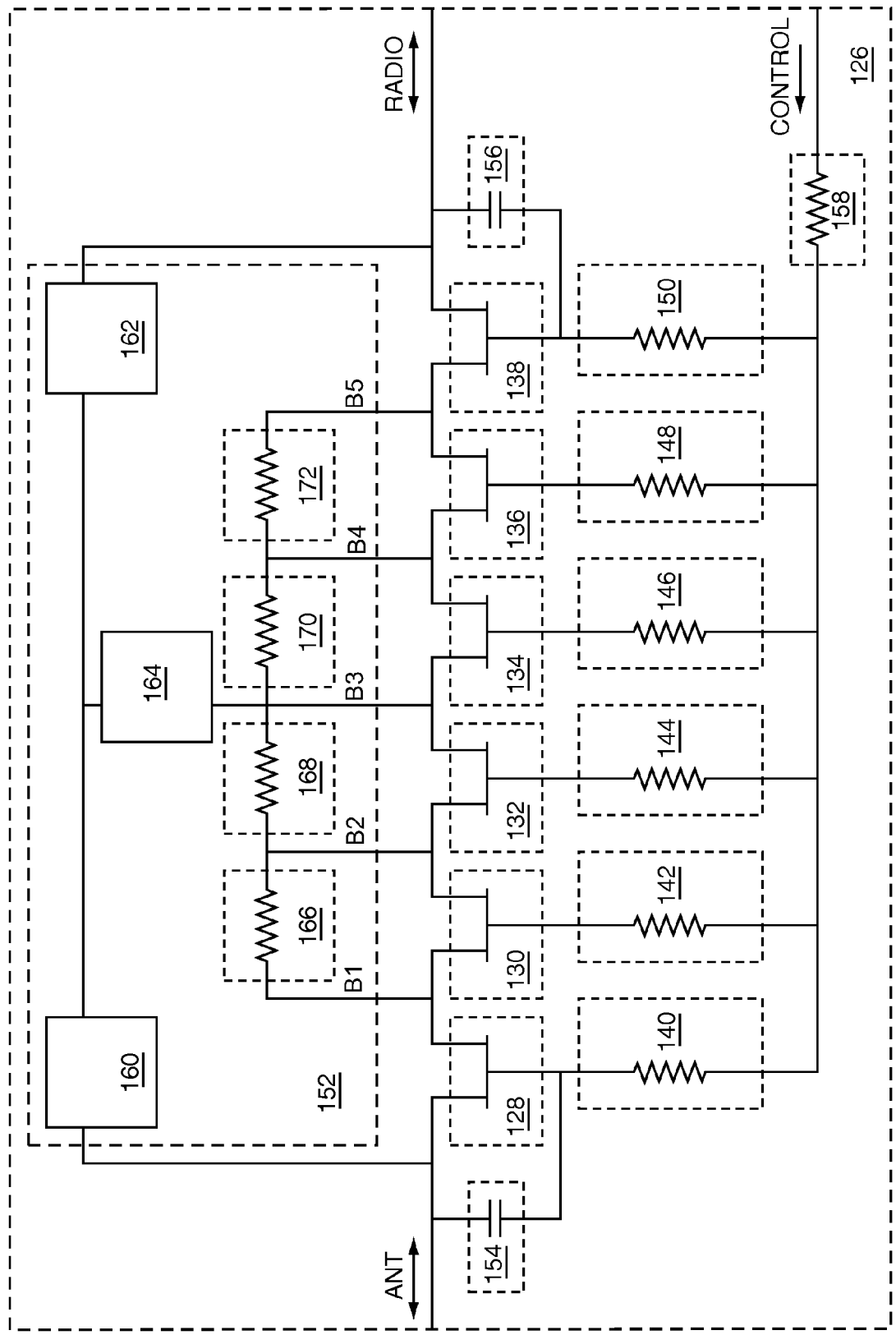

FIG. 16A shows a block representation of bias circuitry including a first bias circuit, a first bias network, a second bias network, a third bias network, a fourth bias network, a fifth bias network, and a sixth bias network.

Figure 16B:
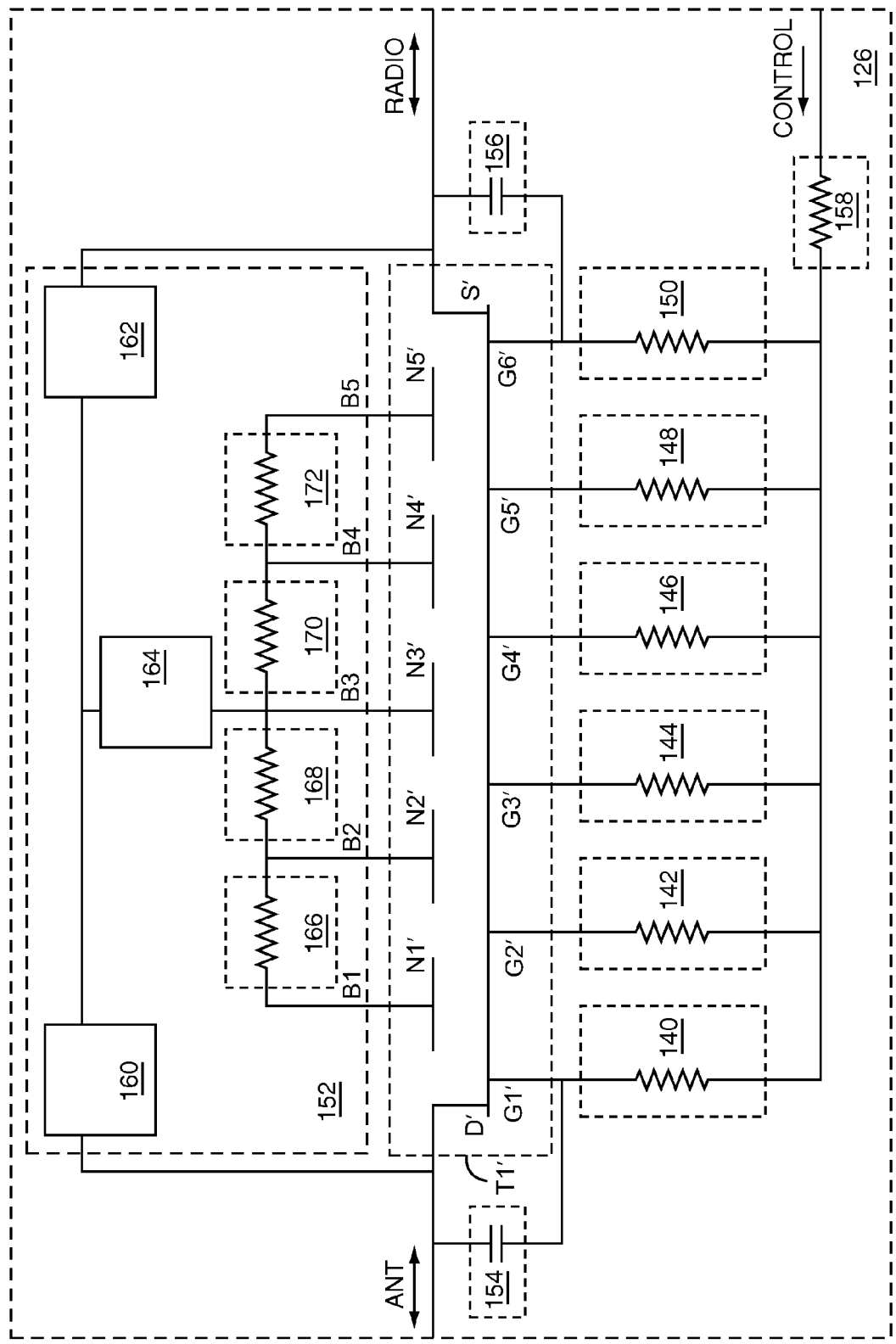

FIG. 16B modifies the embodiment of 16A with a multiple gate transistor configuration that provides an accessible source-drain node.

Figure 17A:
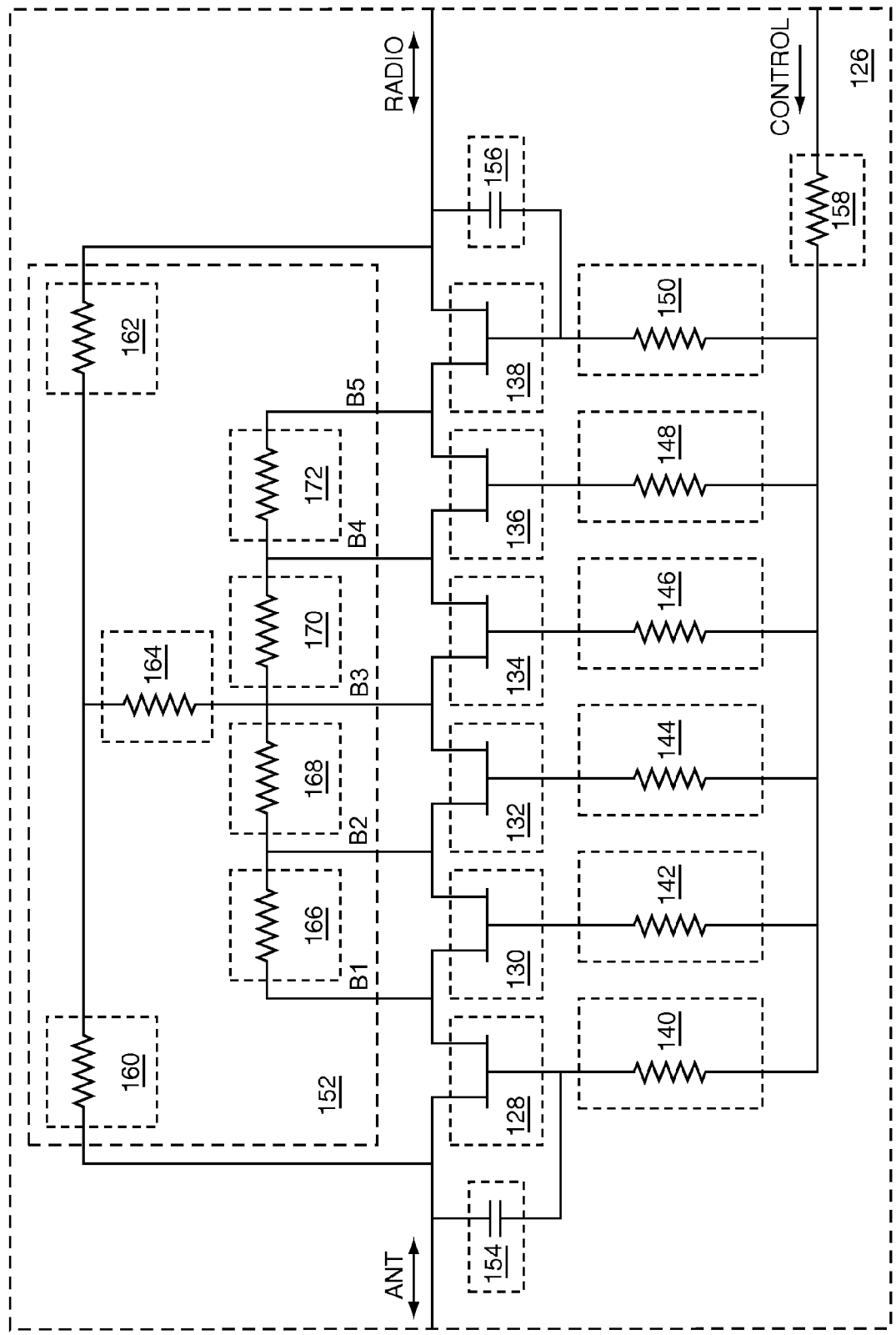

FIG. 17A shows the first bias circuit of FIG. 16A as a resistive element.

Figure 17B:
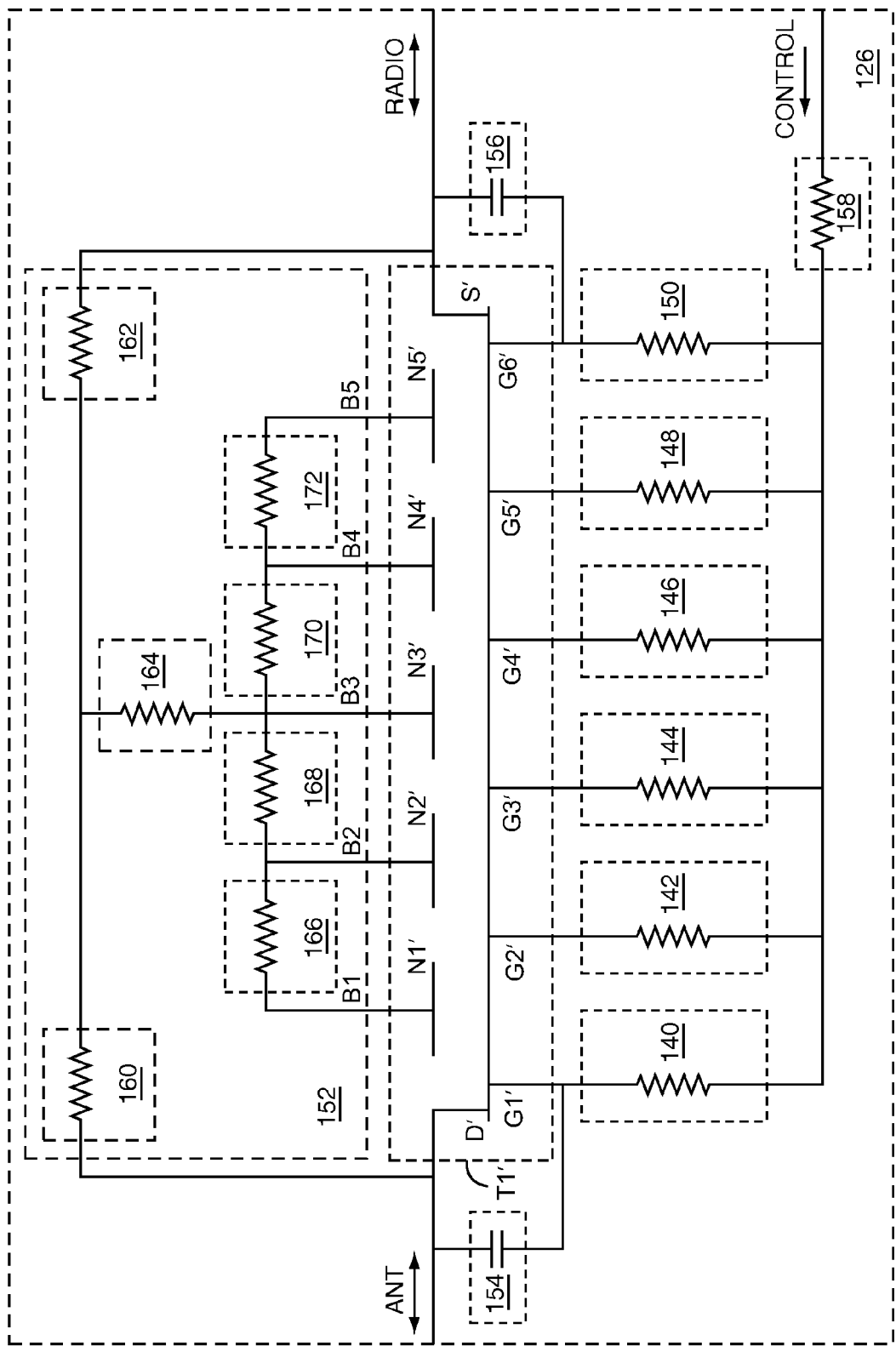

FIG. 17B modifies the embodiment of 17A with a multiple gate transistor configuration that provides an accessible source-drain node.

Figure 18A:
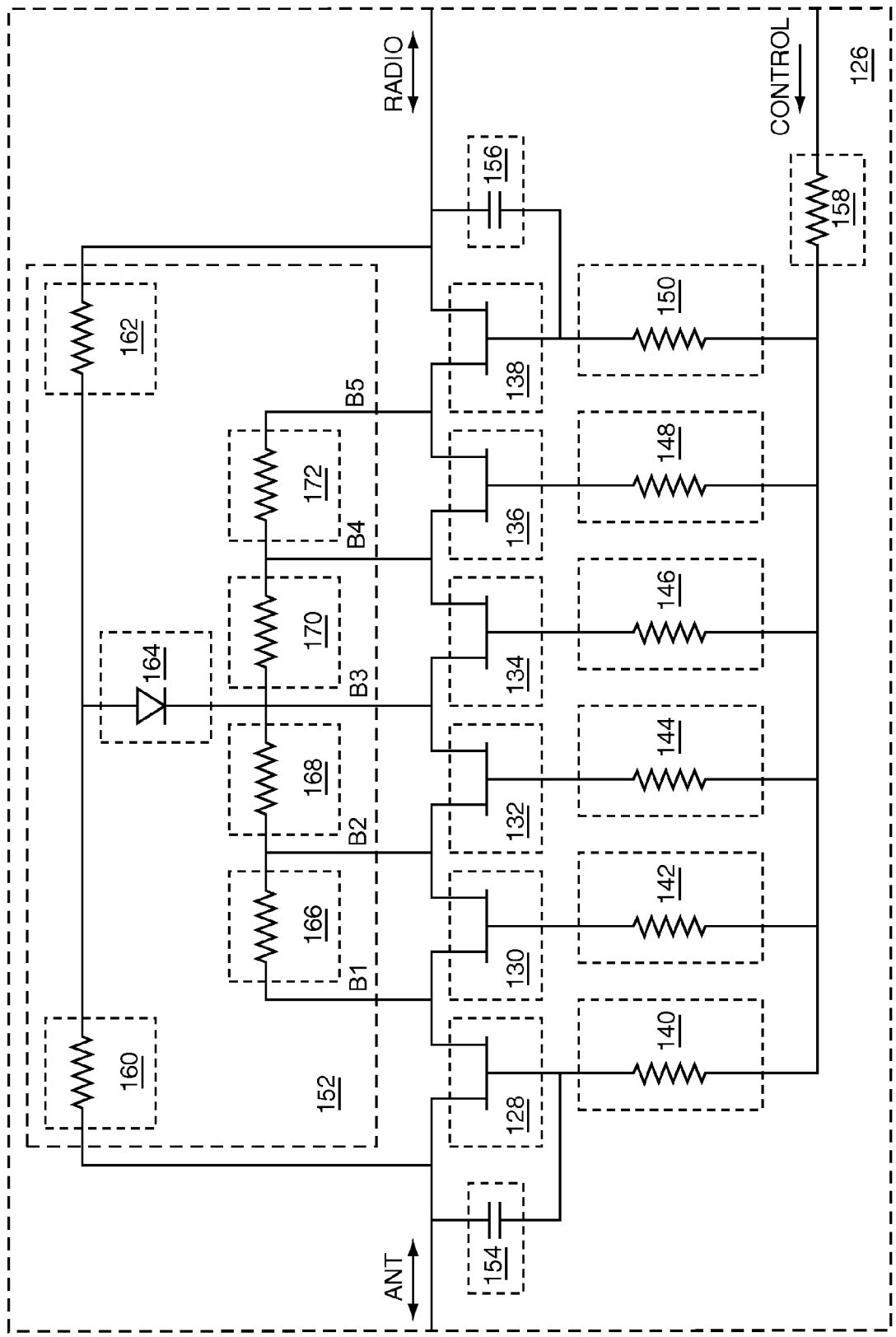

FIG. 18A shows the first bias circuit of FIG. 17A as a diode element.

Figure 18B:
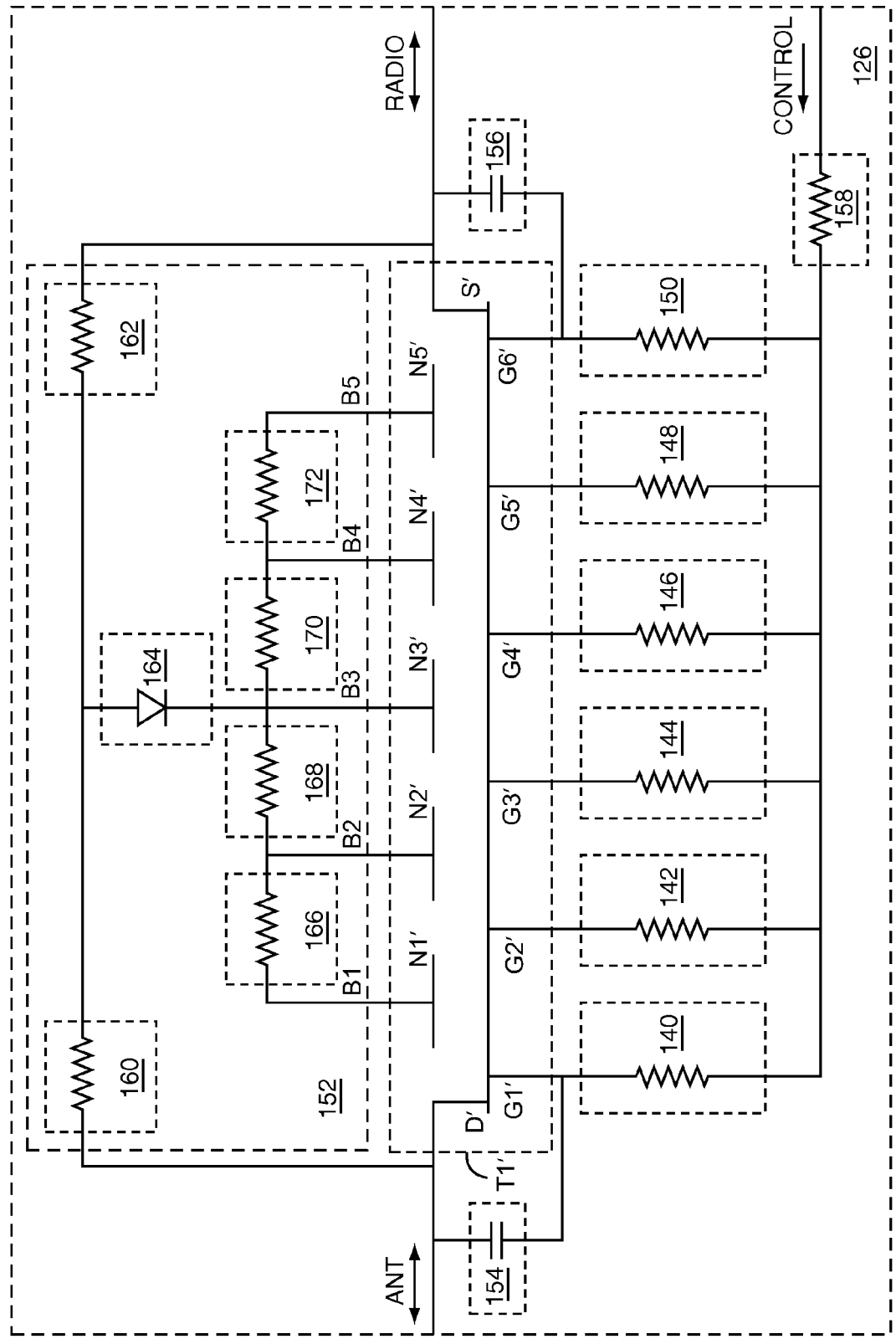

FIG. 18B modifies the embodiment of 18A with a multiple gate transistor configuration that provides an accessible source-drain node.

Figure 19A:
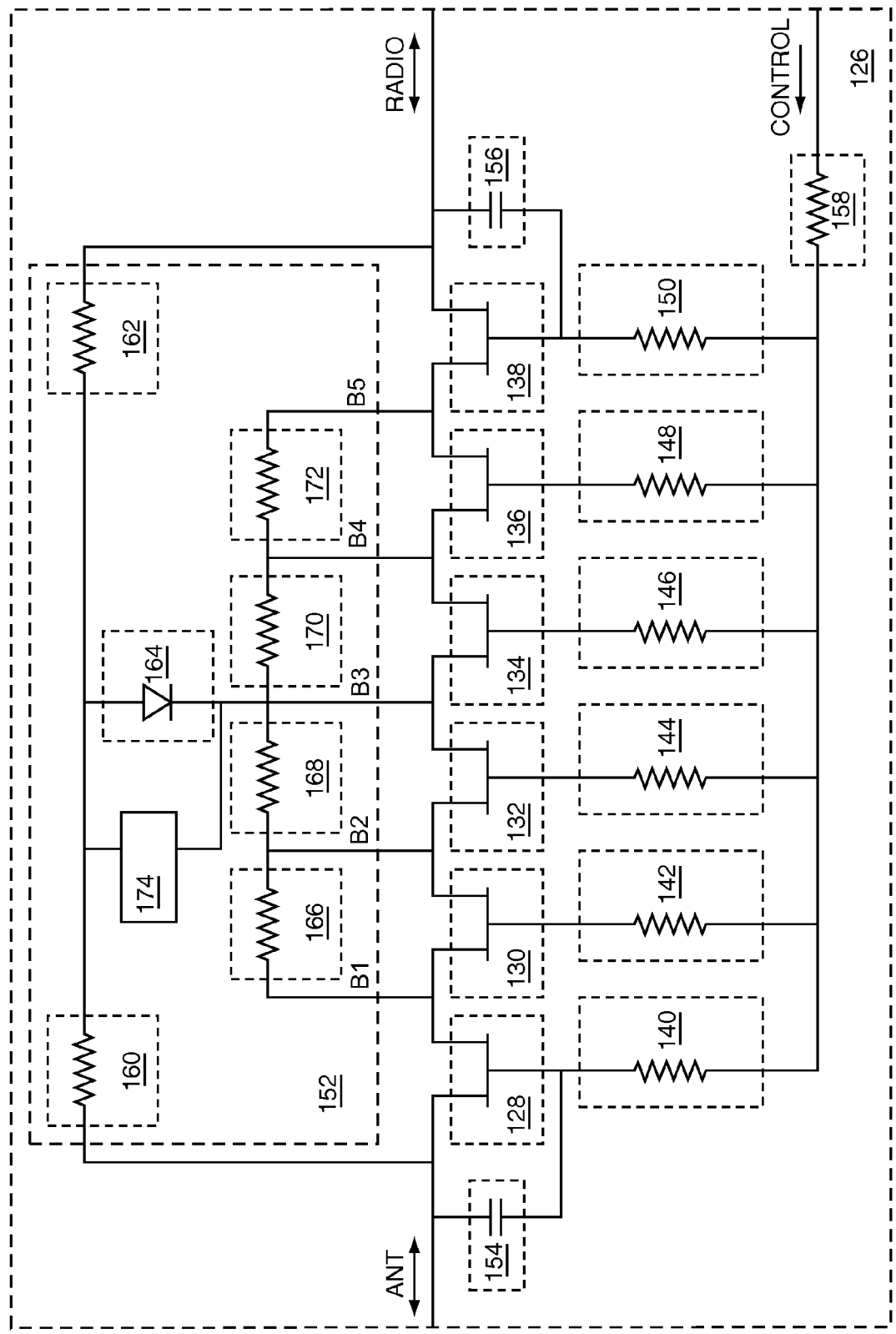

FIG. 19A adds a first RF bypass network to the embodiment shown in FIG. 18A.

Figure 19B:
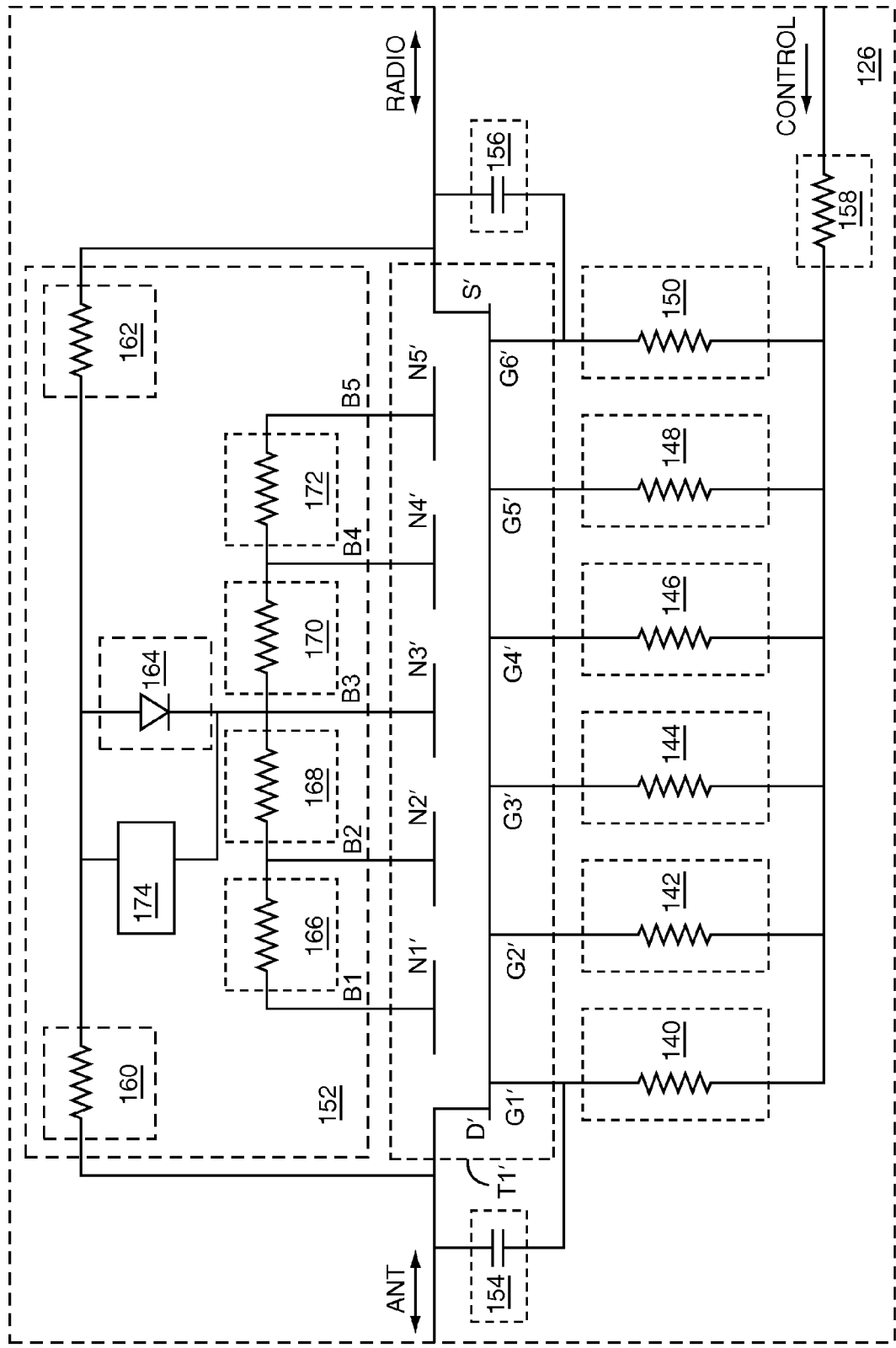

FIG. 19B modifies the embodiment of 19A with a multiple gate transistor configuration that provides an accessible source-drain node.

Figure 20A:
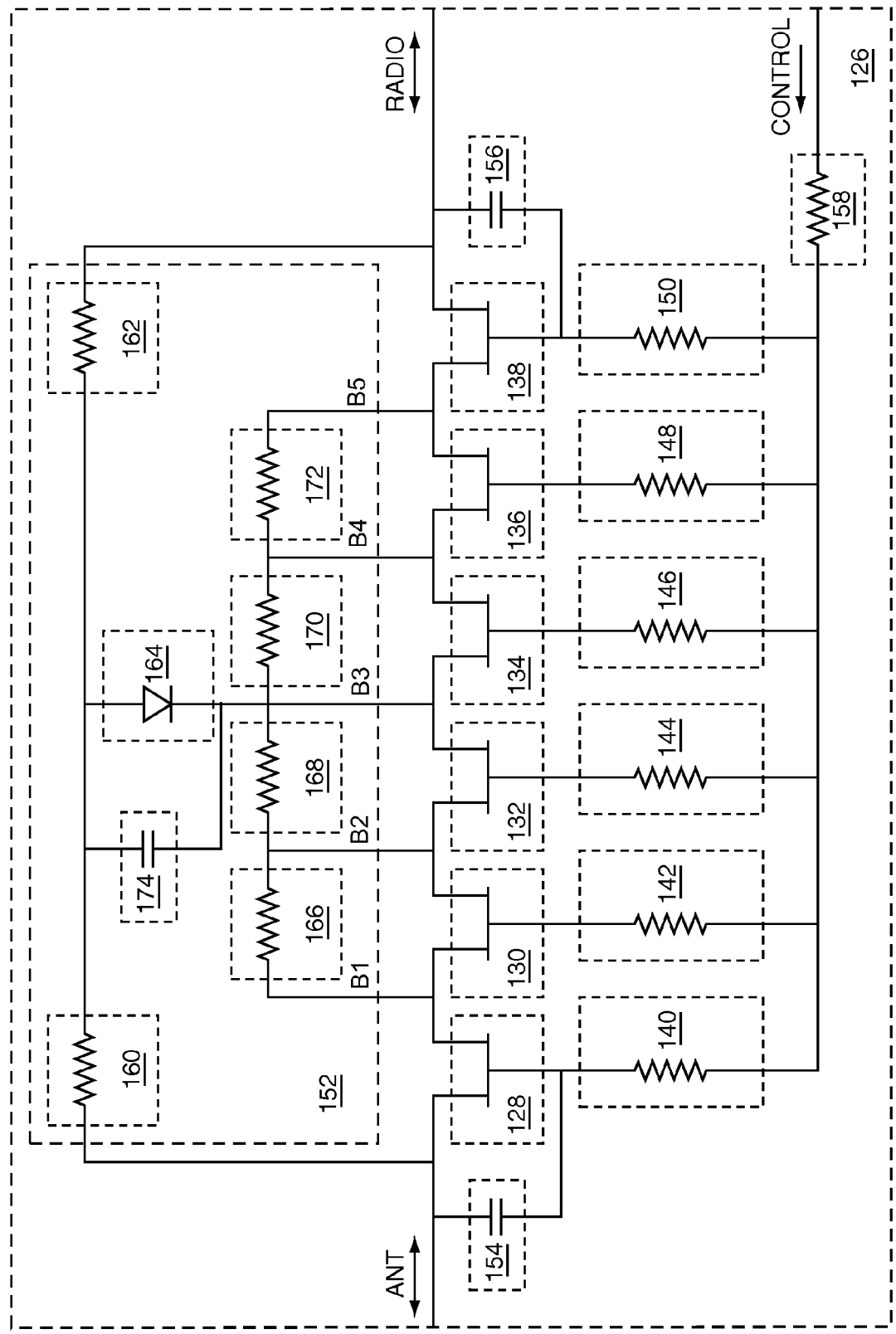

FIG. 20A shows the first RF bypass network of FIG. 19A as a capacitive element.

Figure 20B:
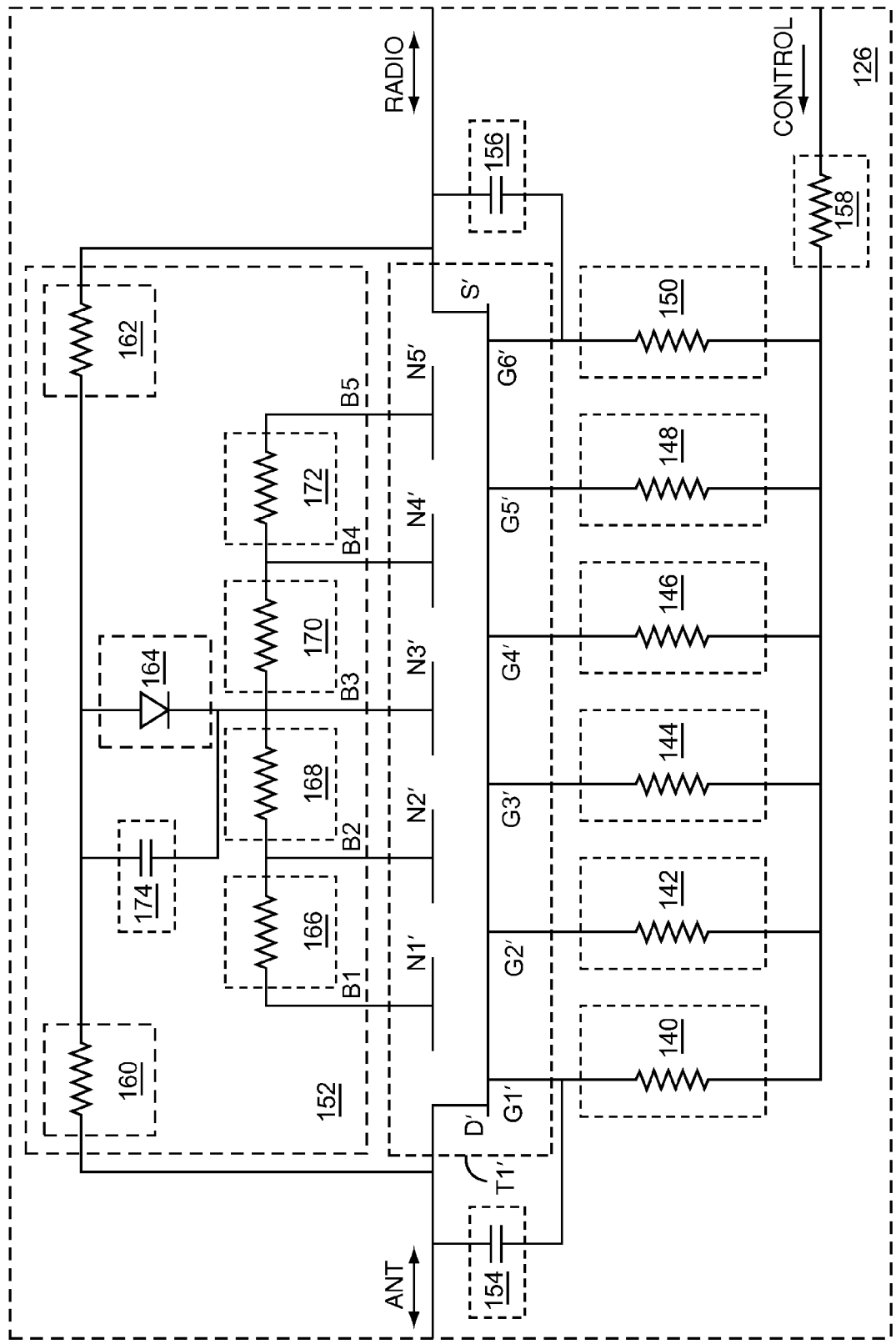

FIG. 20B modifies the embodiment of 20A with a multiple gate transistor configuration that provides an accessible source-drain node.

Figure 21A:
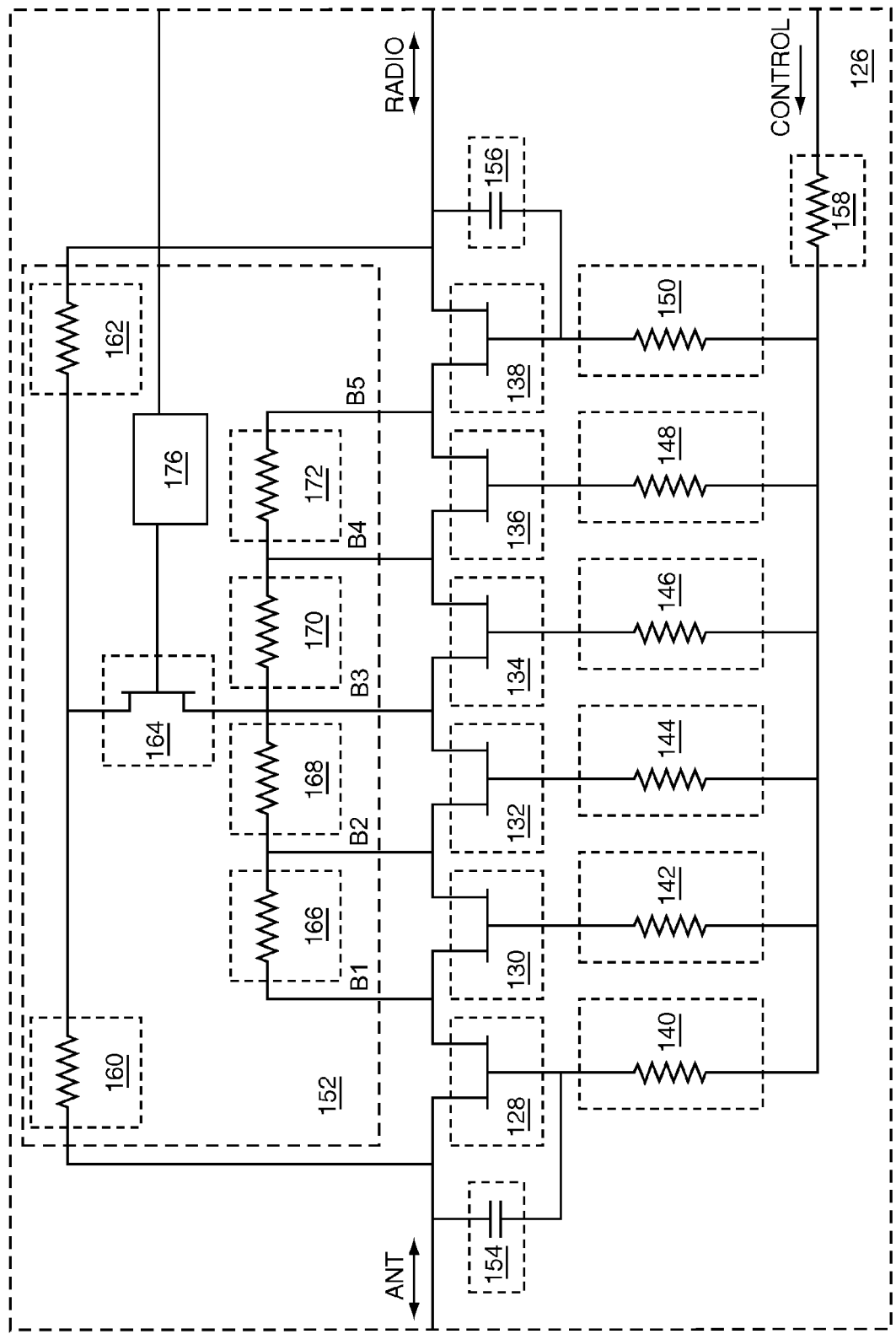

FIG. 21A shows the first bias circuit of FIG. 17A as a bias switching transistor element, and adds a bias switching transistor control network.

Figure 21B:
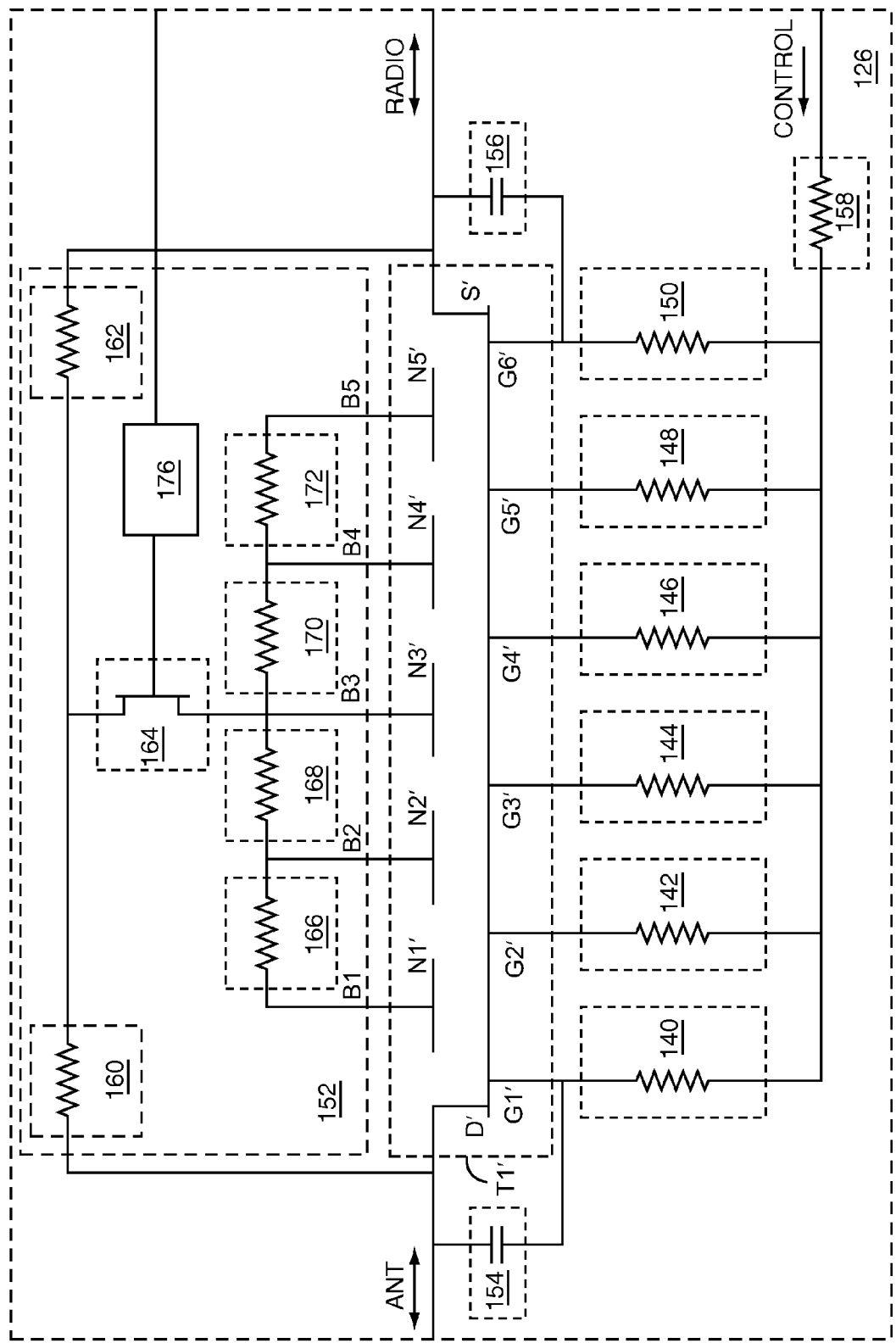

FIG. 21B modifies the embodiment of 21A with a multiple gate transistor configuration that provides an accessible source-drain node.

Figure 22A:
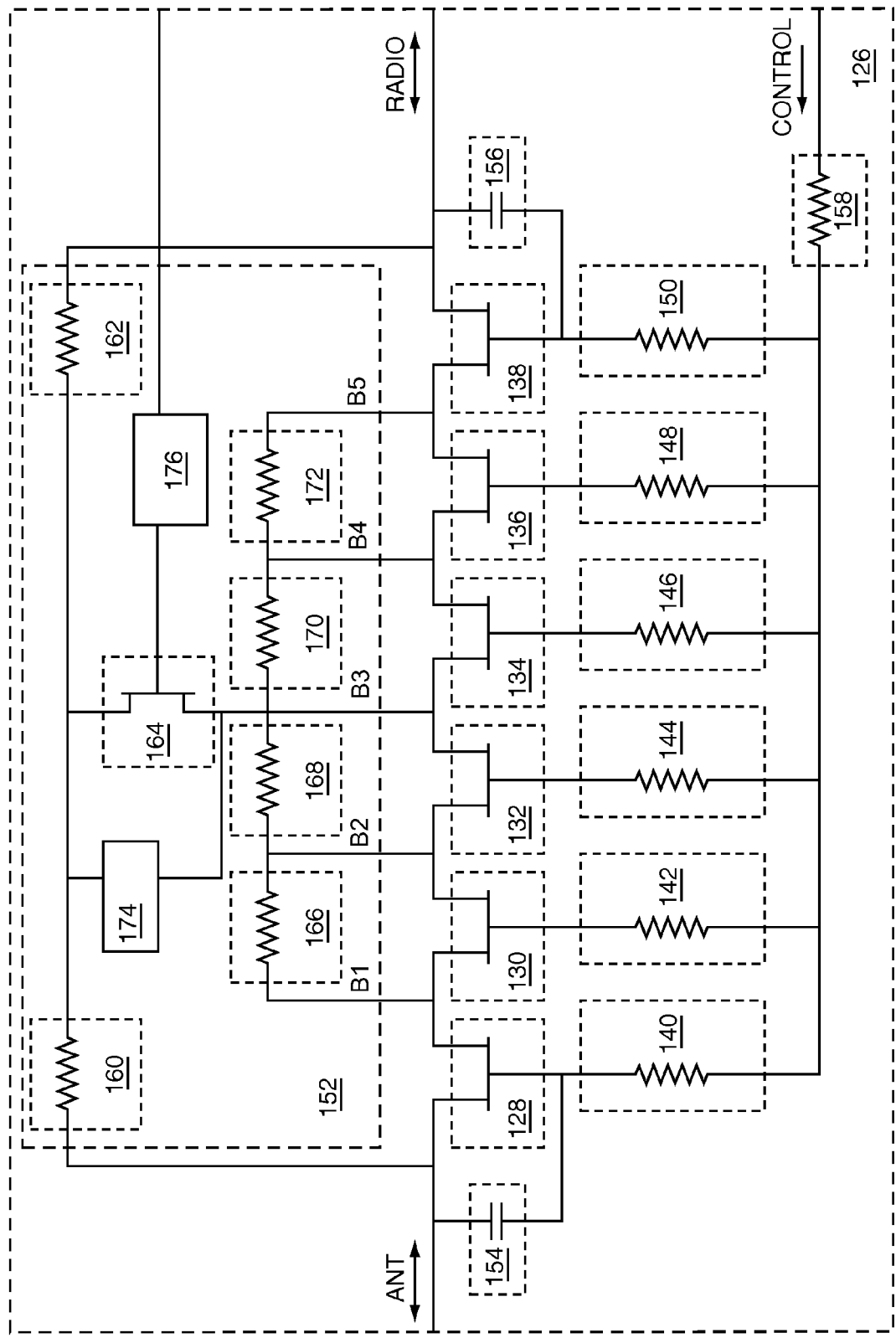

FIG. 22A adds the first RF bypass network to the third embodiment shown in FIG. 21A.

Figure 22B:
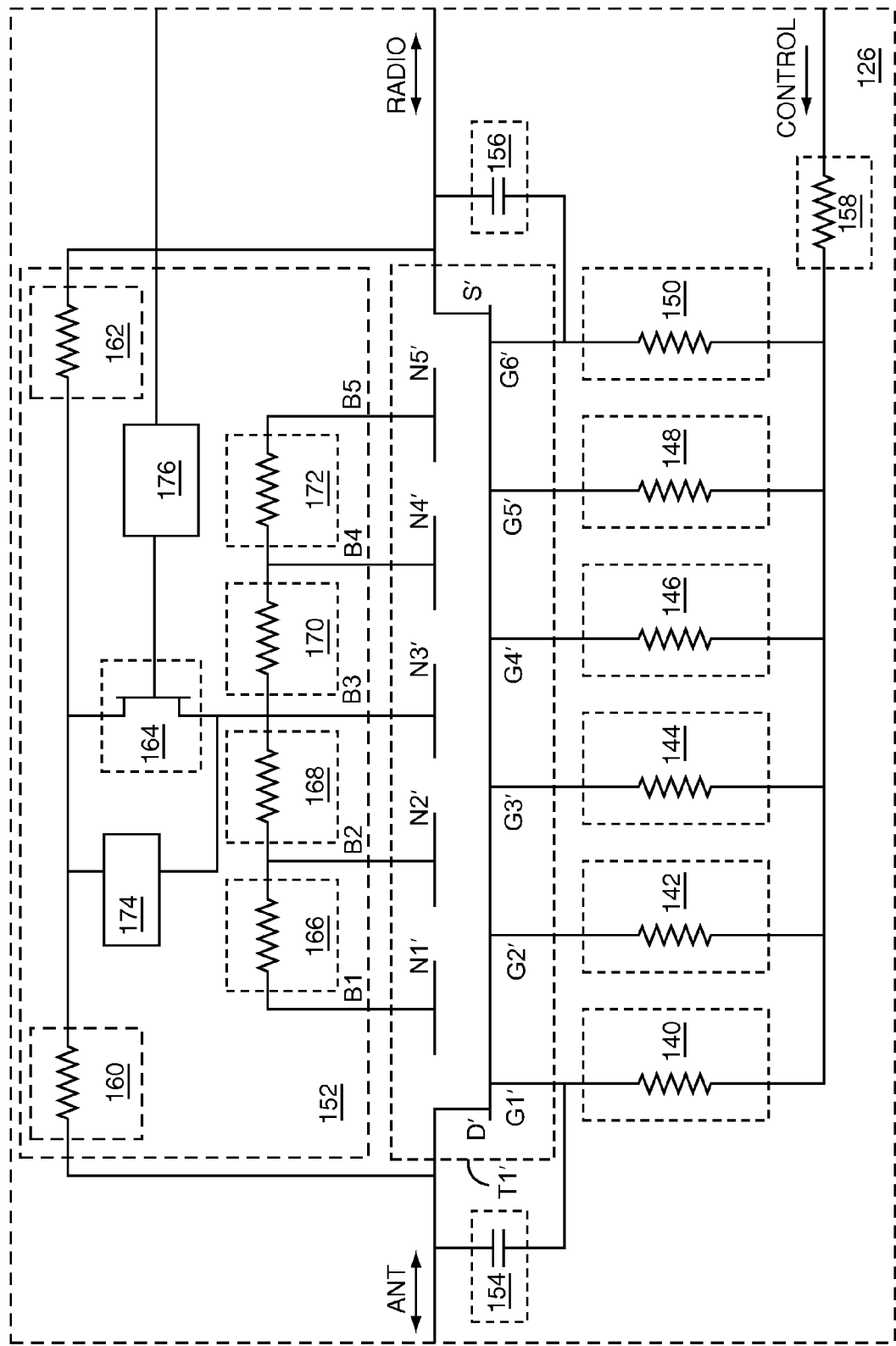

FIG. 22B modifies the embodiment of 22A with a multiple gate transistor configuration that provides an accessible source-drain node.

Figure 23A:
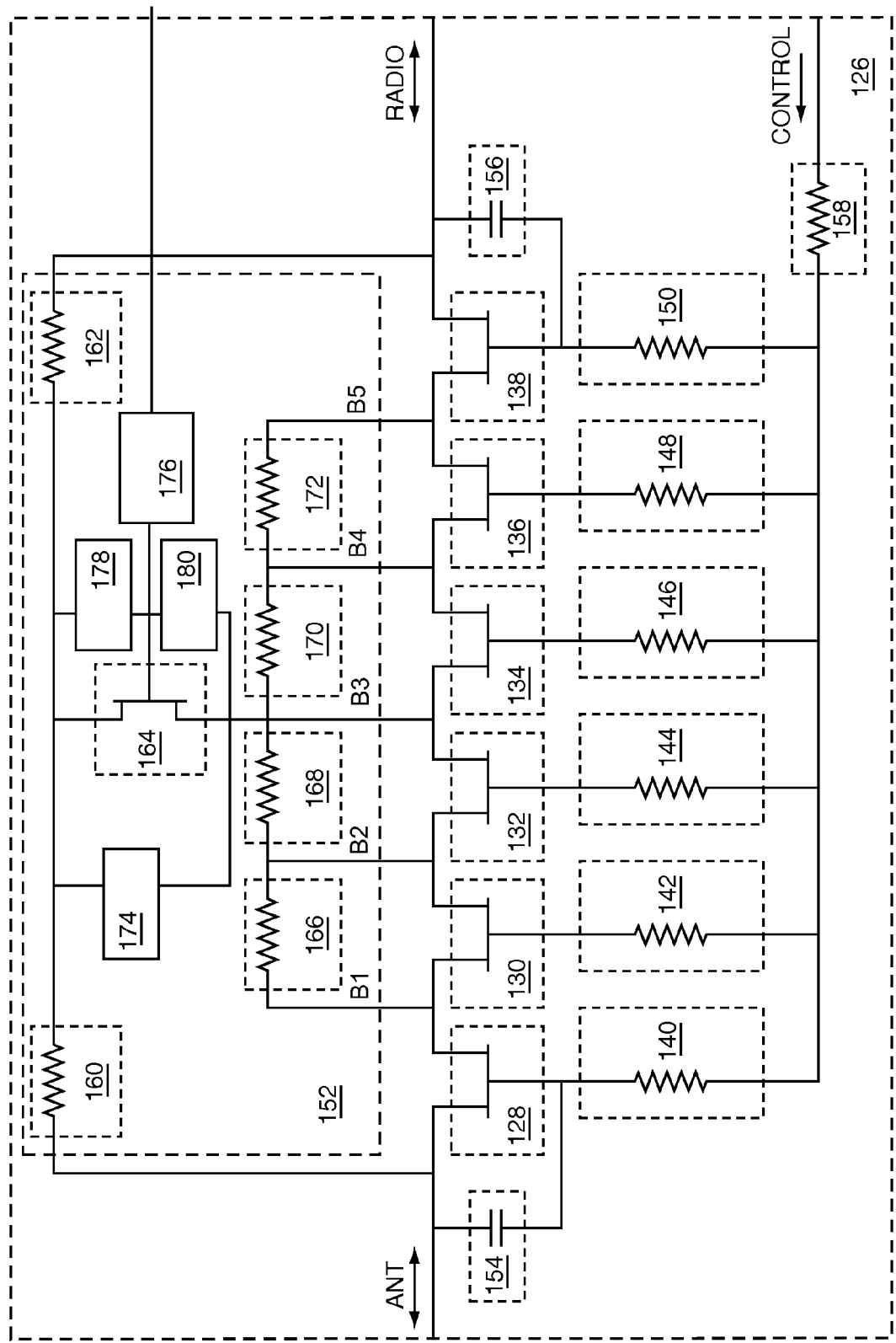

FIG. 23A adds a second RF bypass network and a third RF bypass network to the embodiment shown in FIG. 22A.

Figure 23B:
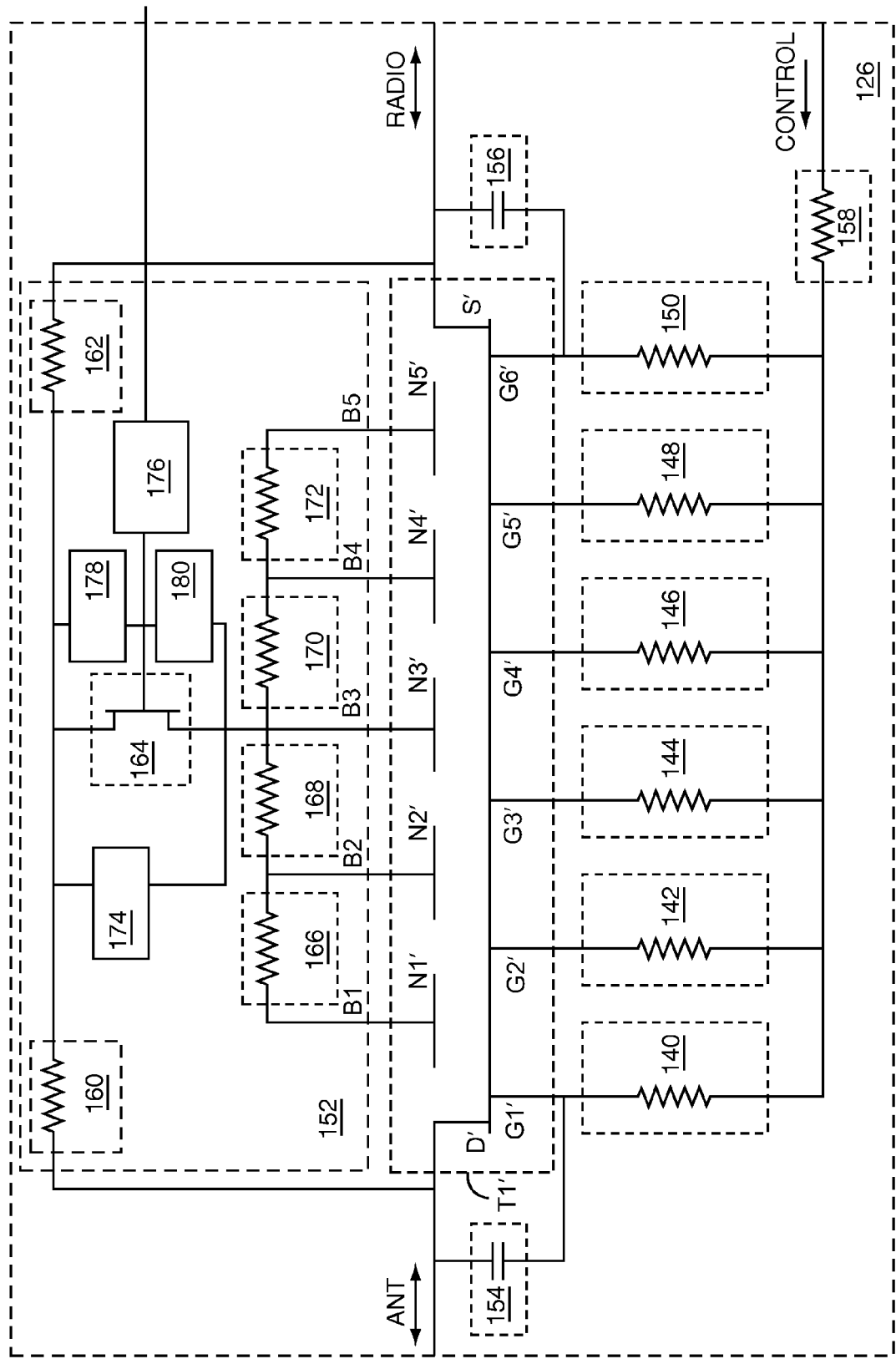

FIG. 23B modifies the embodiment of 23A with a multiple gate transistor configuration that provides an accessible source-drain node.

Figure 24A:
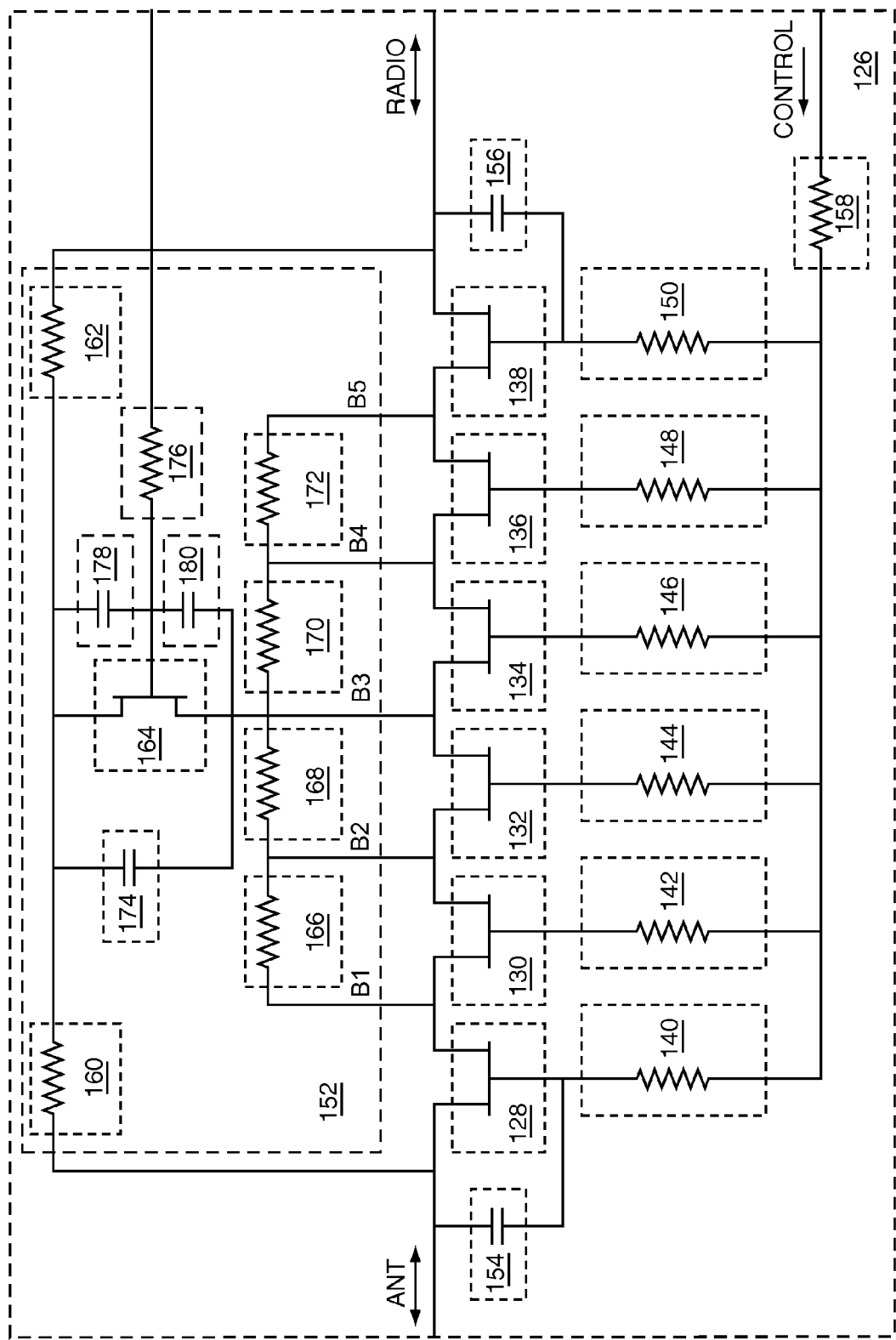

FIG. 24A shows the first, second, and third RF bypass networks of FIG. 23A as capacitive elements, and the bias switching transistor control network as a resistive element.

Figure 24B:
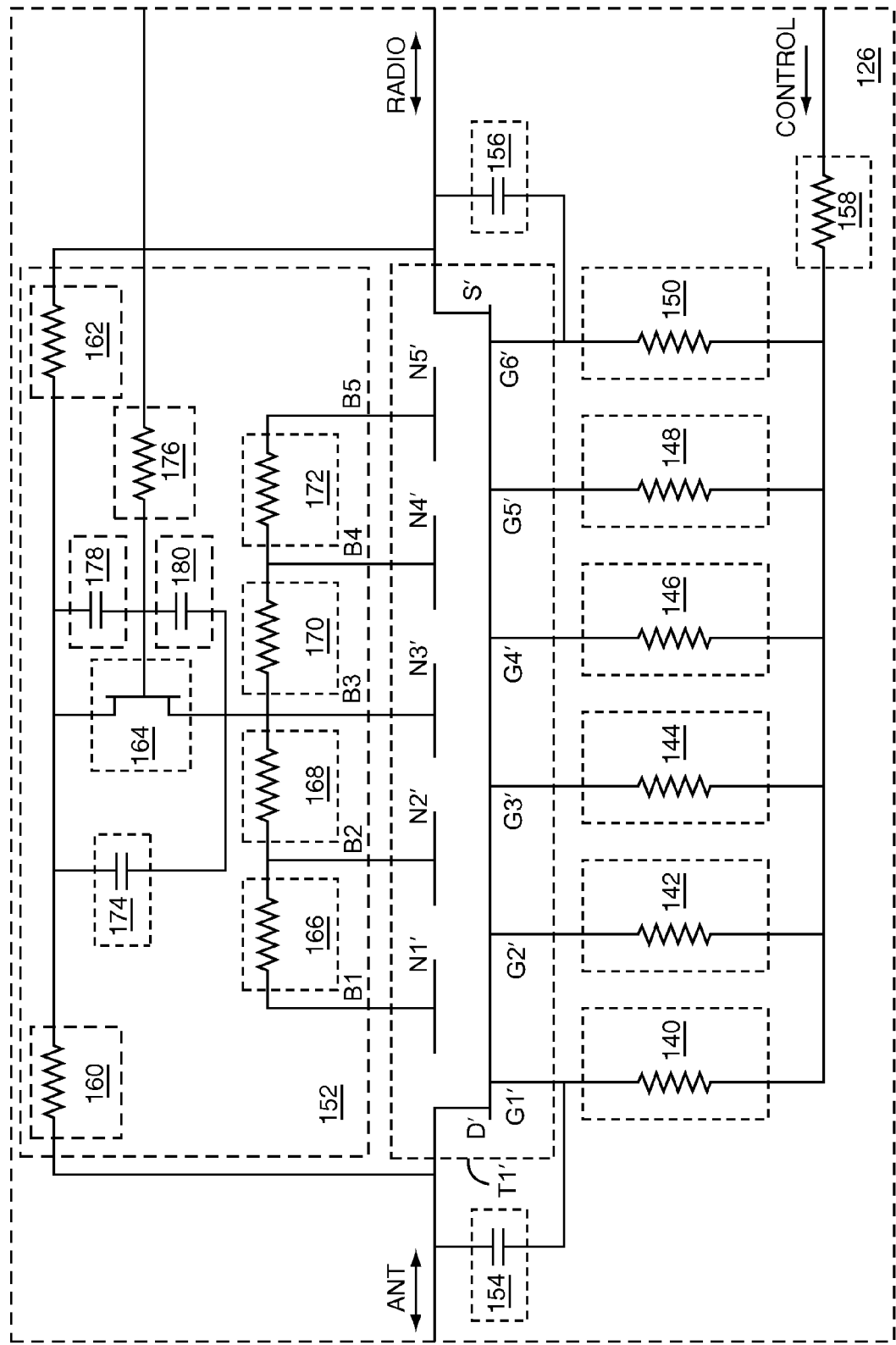

FIG. 24B modifies the embodiment of 24A with a multiple gate transistor configuration that provides an accessible source-drain node.

Figure 25A:
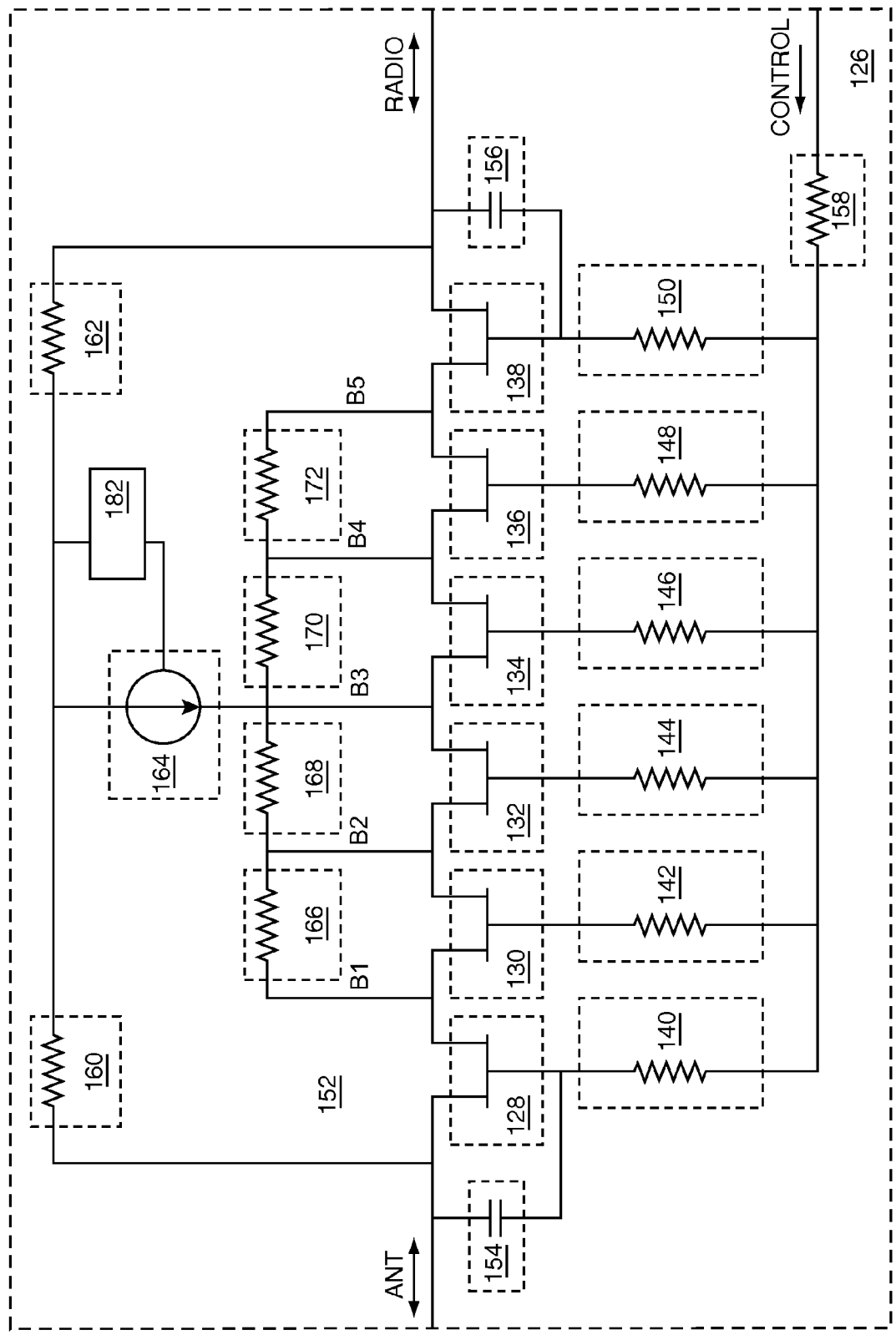

FIG. 25A shows the first bias circuit of FIG. 17A as a current source, which is coupled to a current source control network.

Figure 25B:
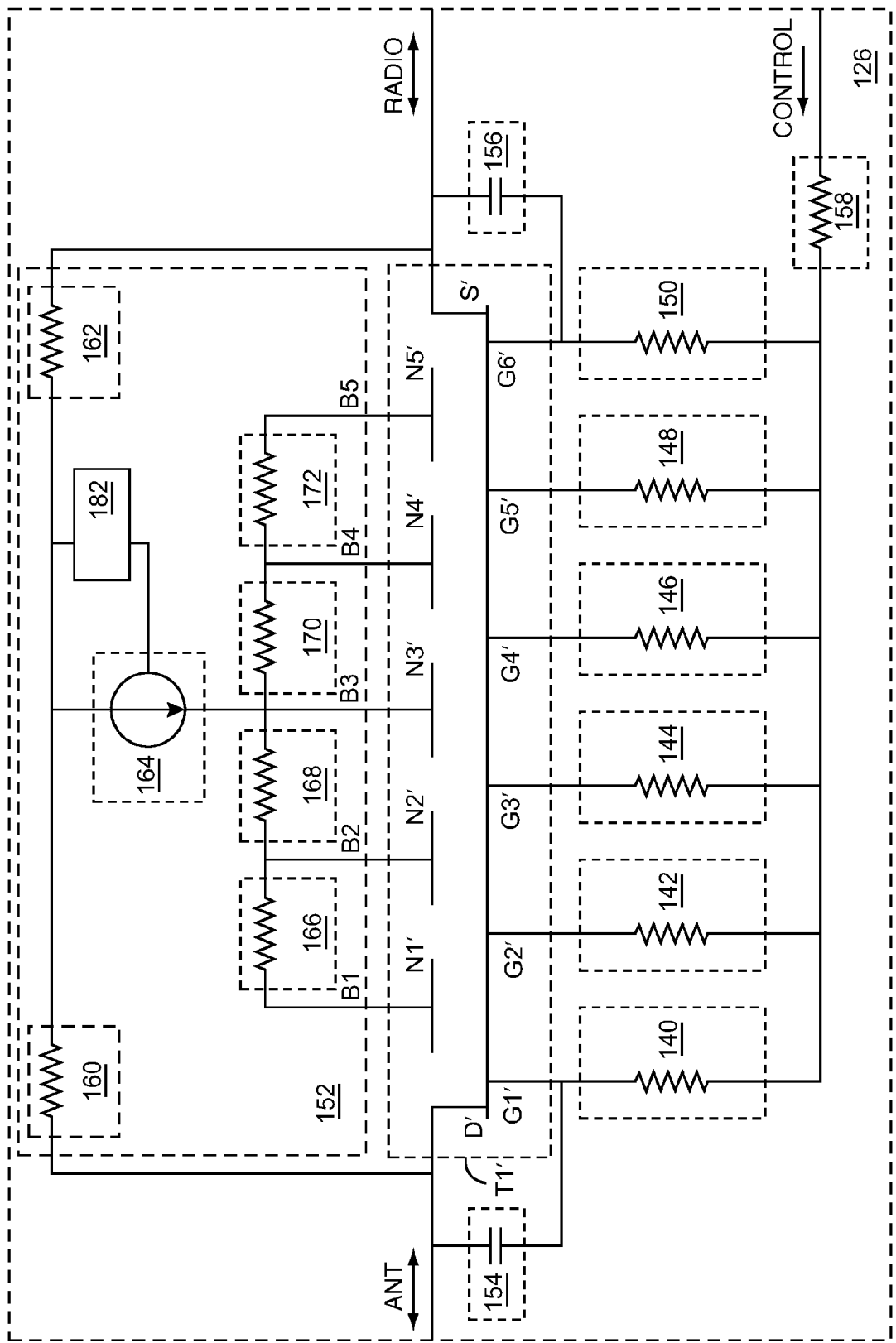

FIG. 25B modifies the embodiment of 25A with a multiple gate transistor configuration that provides an accessible source-drain node.

Figure 26A:
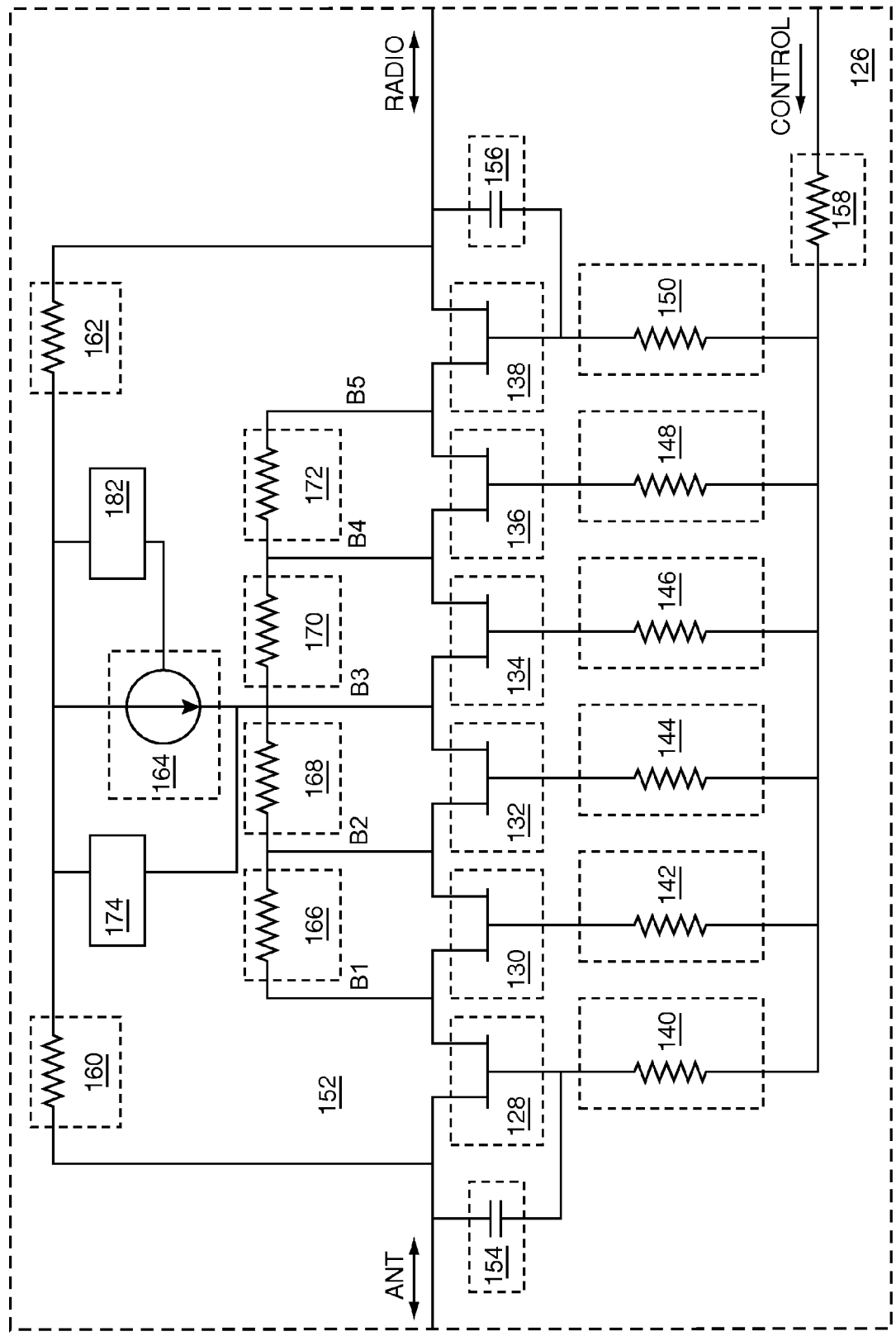

FIG. 26A adds the first RF bypass network to the embodiment shown in FIG. 25A.

Figure 26B:
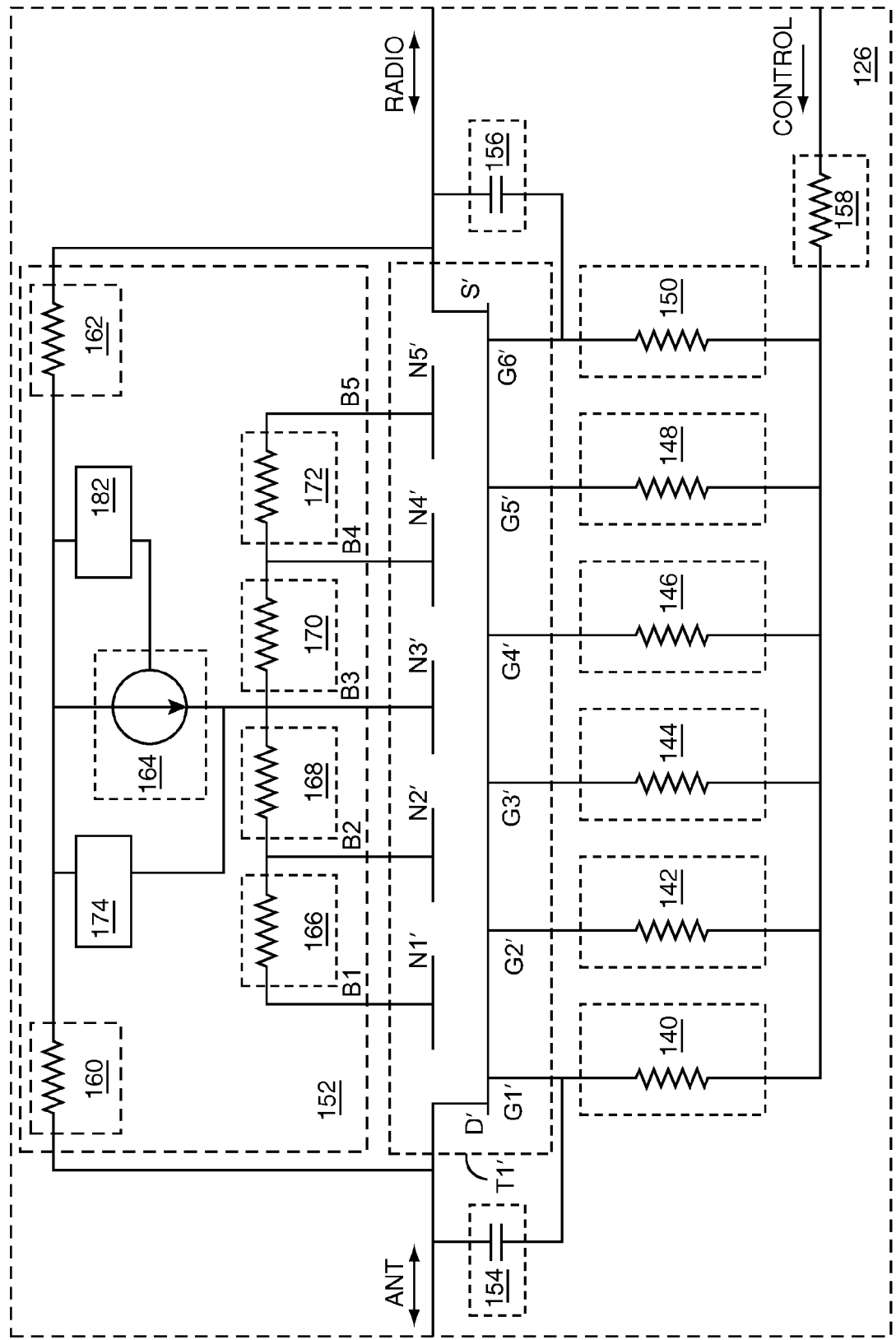

FIG. 26B modifies the embodiment of 26A with a multiple gate transistor configuration that provides an accessible source-drain node.

Figure 27A:
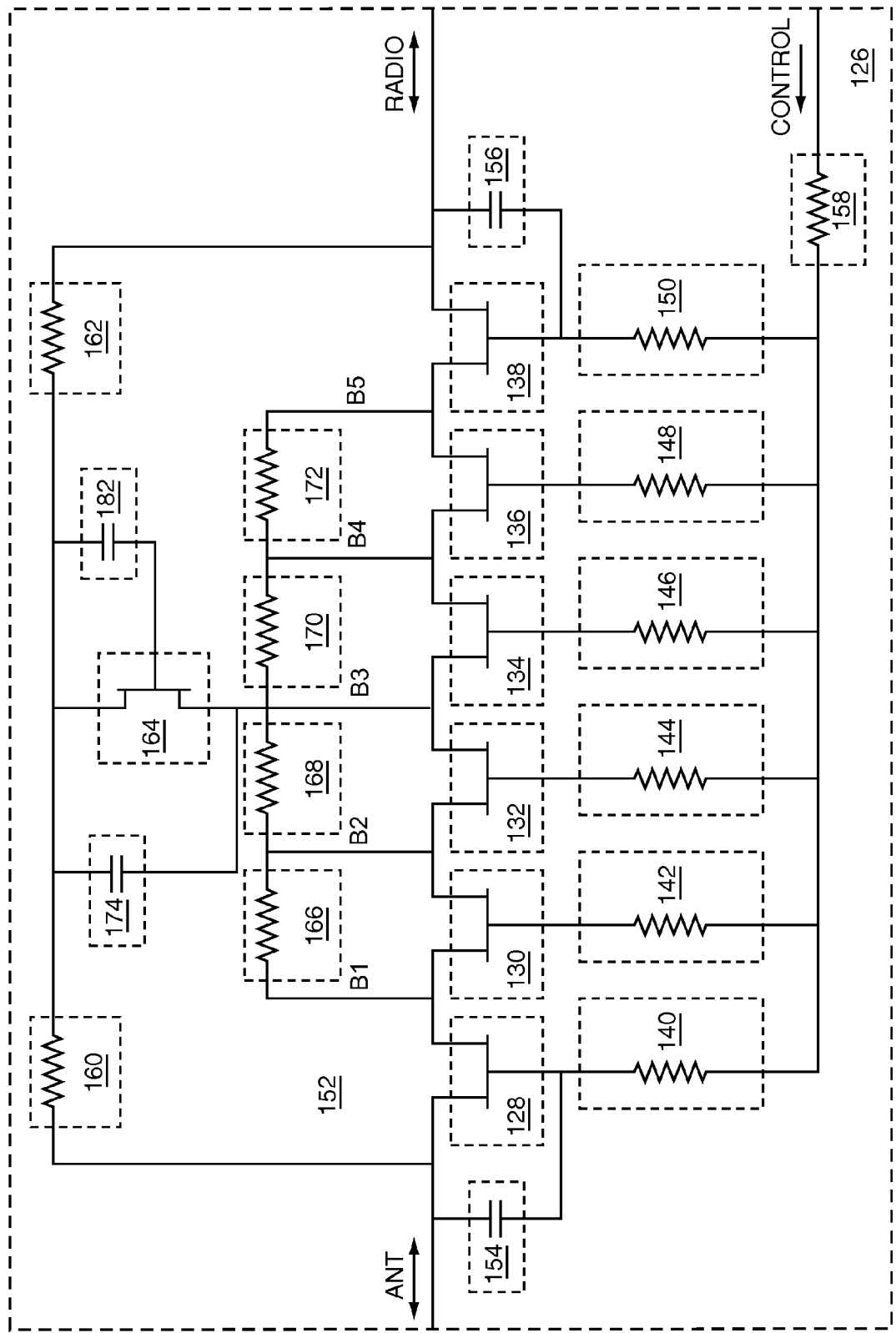

FIG. 27A shows the current source of FIG. 26A as a current source transistor element, the current source control network as a resistive element, and the first RF bypass network as a capacitive element.

Figure 27B:
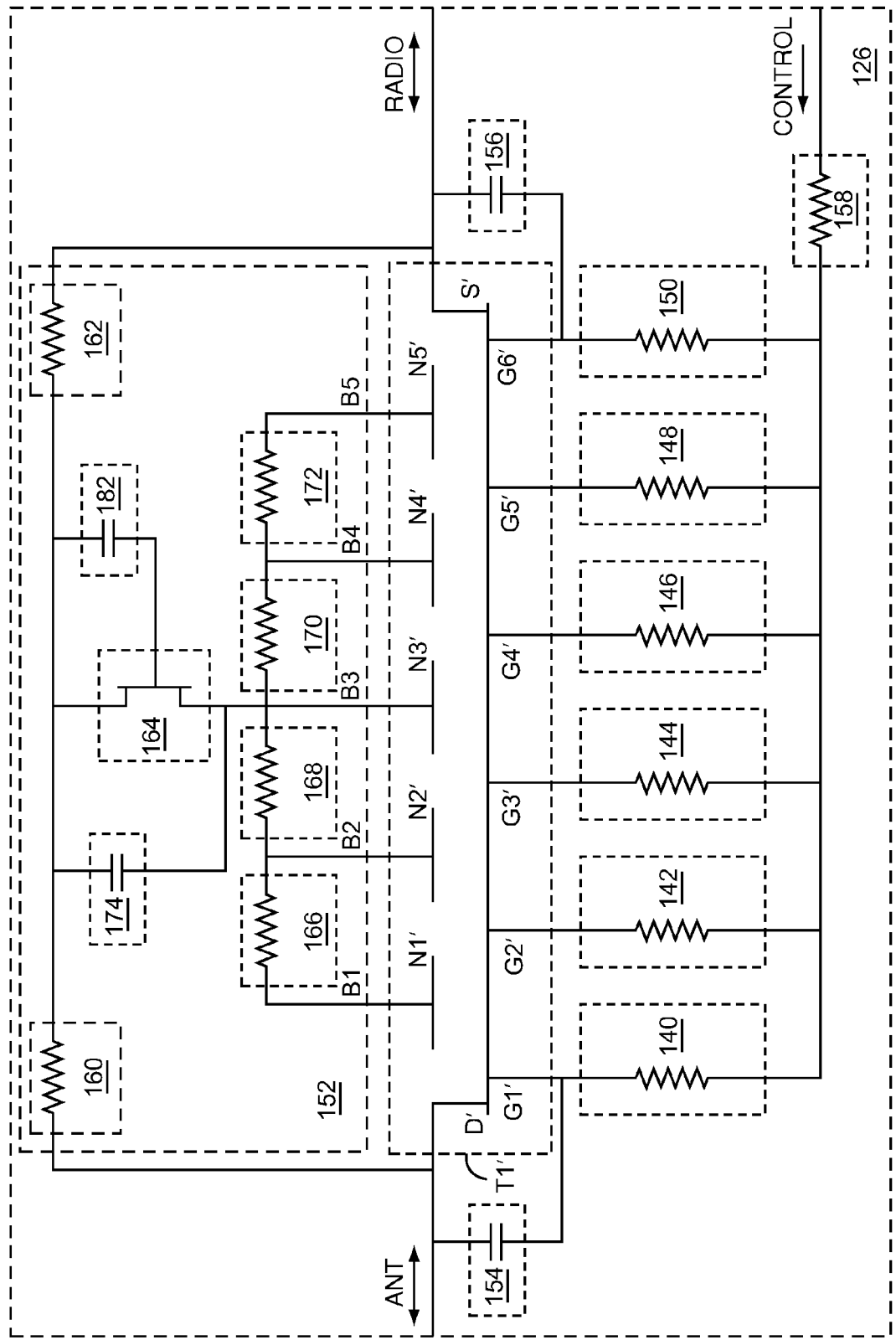

FIG. 27B modifies the embodiment of 27A with a multiple gate transistor configuration that provides an accessible source-drain node.

Figure 28:
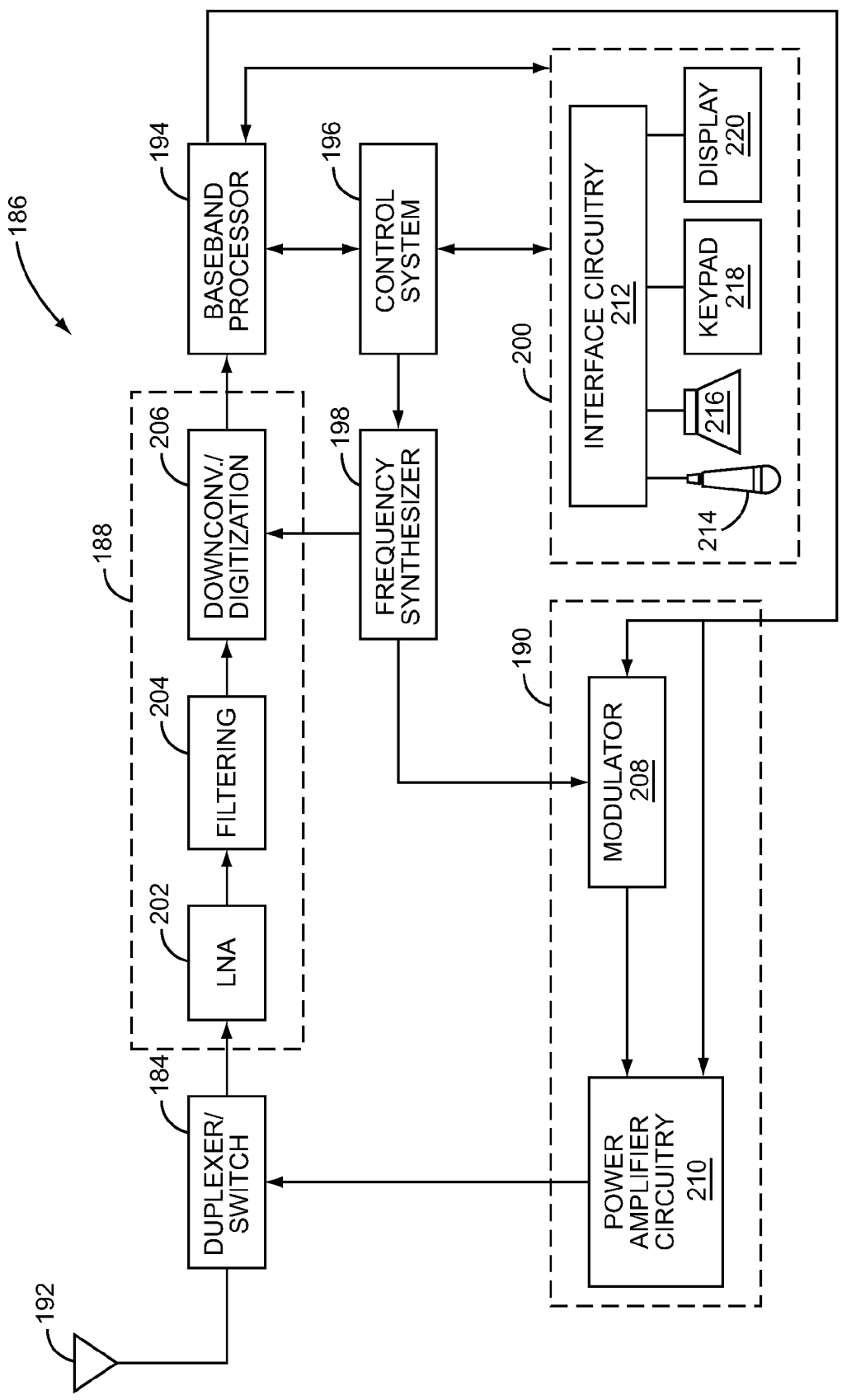

FIG. 28 shows an application example of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
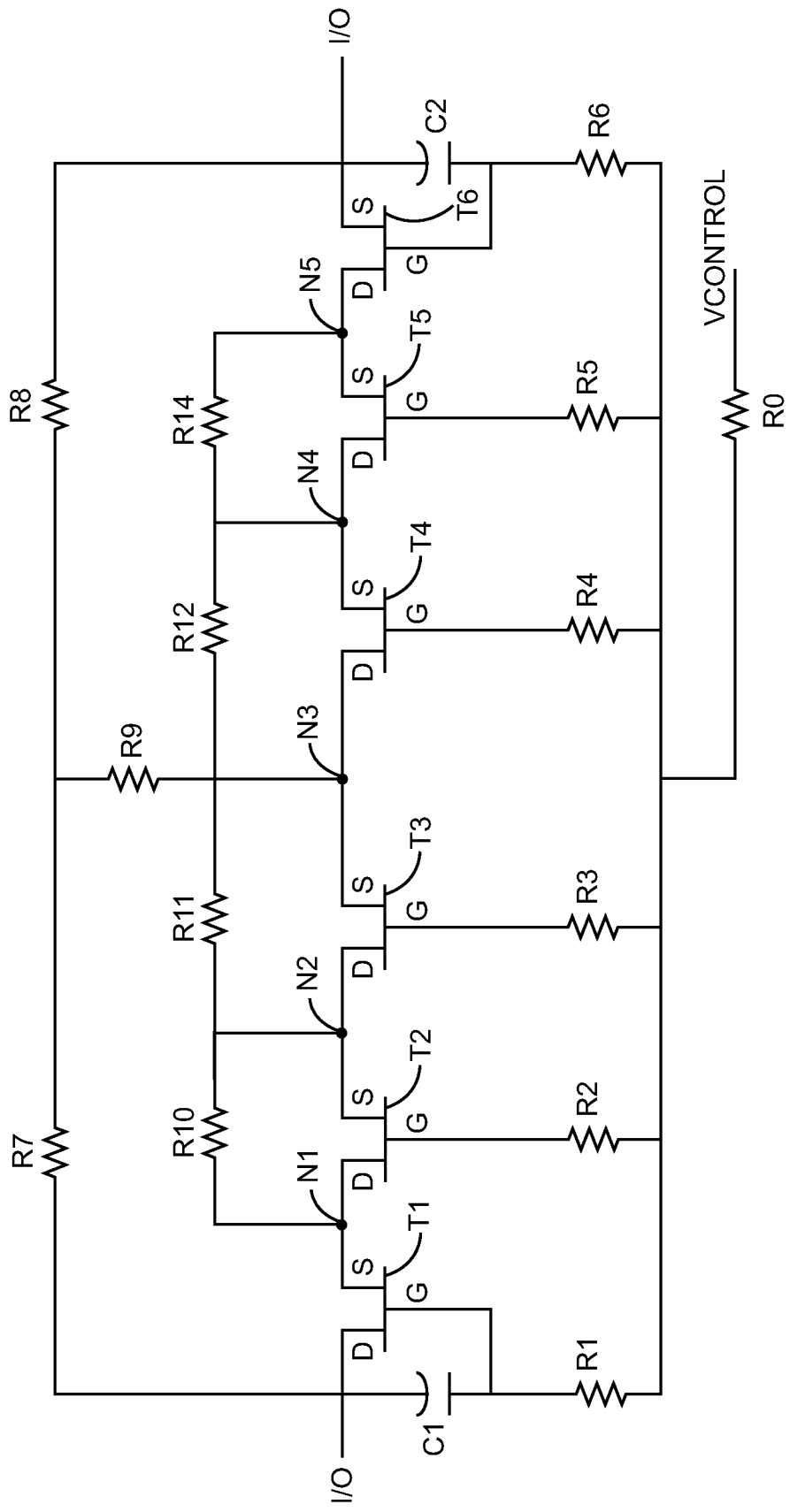
FIG. 1 illustrates a first embodiment of an antenna switch.
Figure 3:
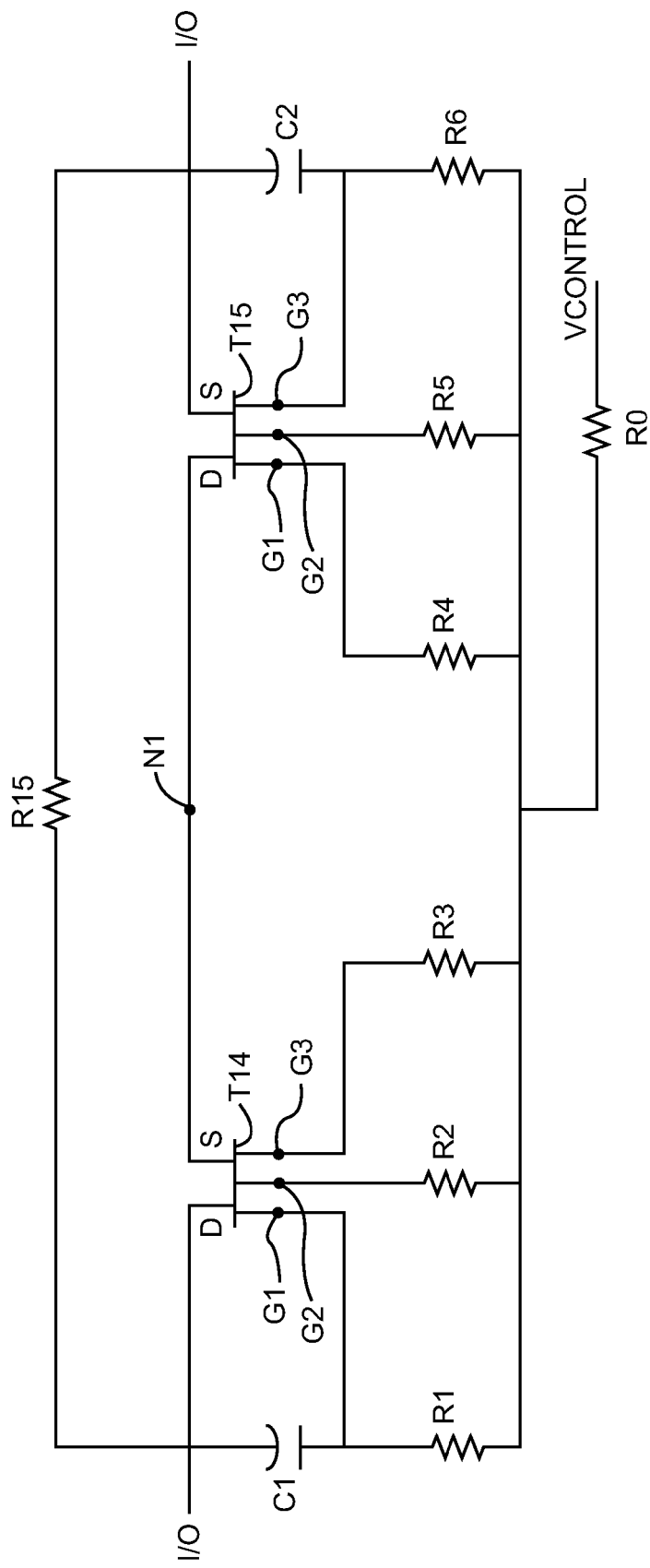
FIG. 3 illustrates an alternative embodiment of the antenna switch where two triple gate transistors are used instead of a six single gate transistors.
Figure 4:
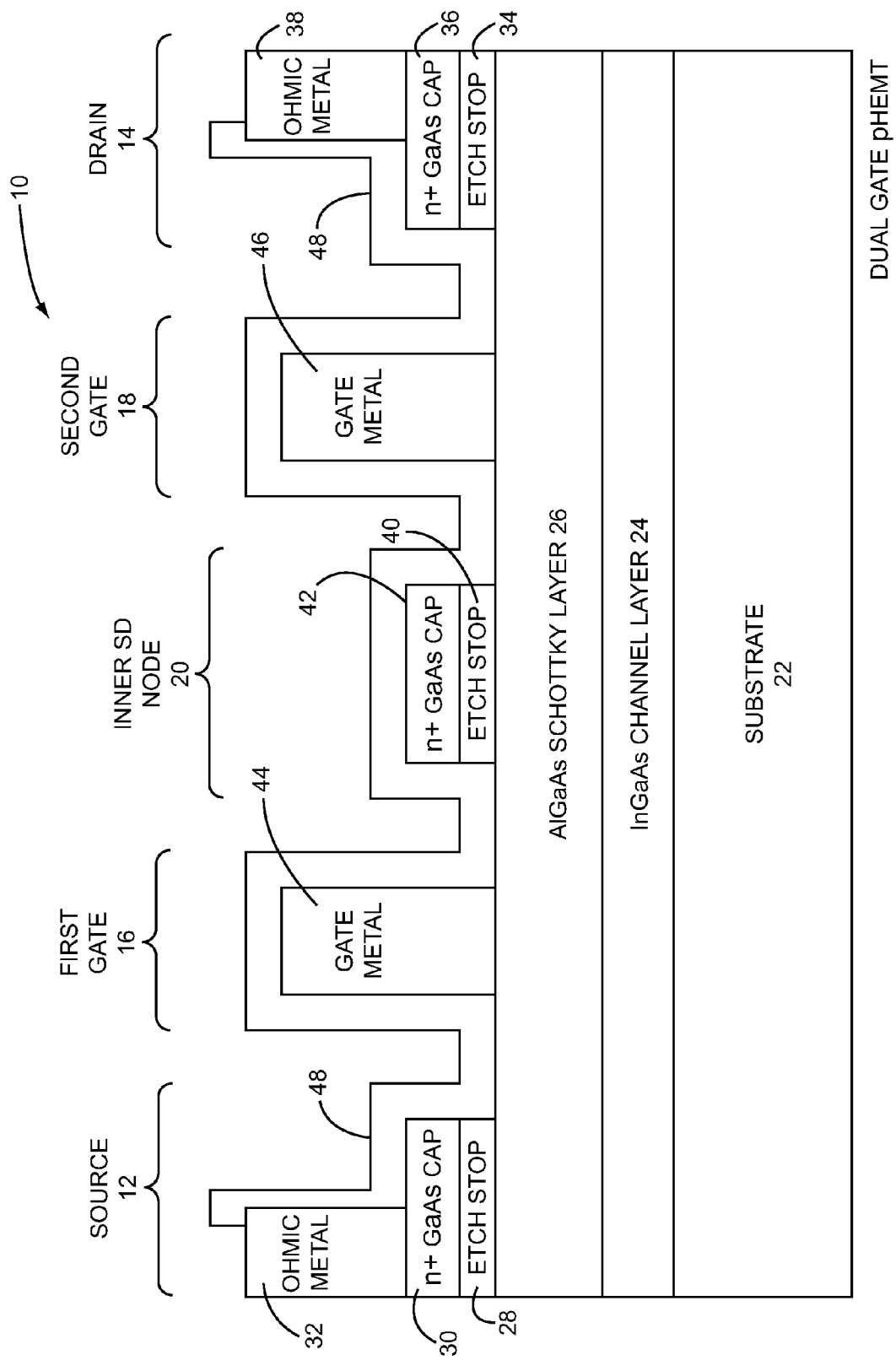
FIG. 4 is a block representation of a pseudomorphic high electron mobility transistor.
Figure 5:
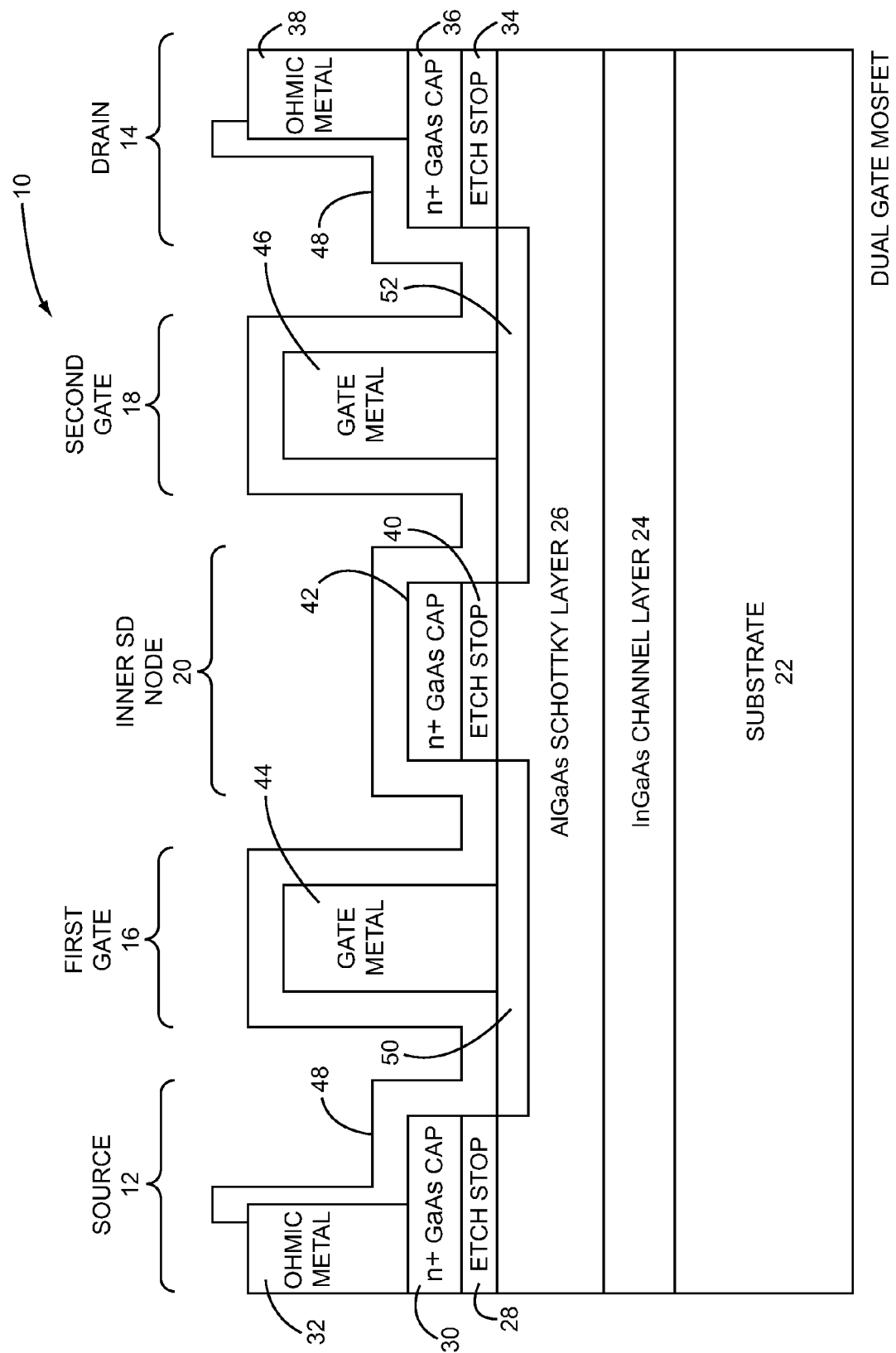
FIG. 5 is a block representation of a metal oxide semiconductor field effect transistor.
Figure 6:
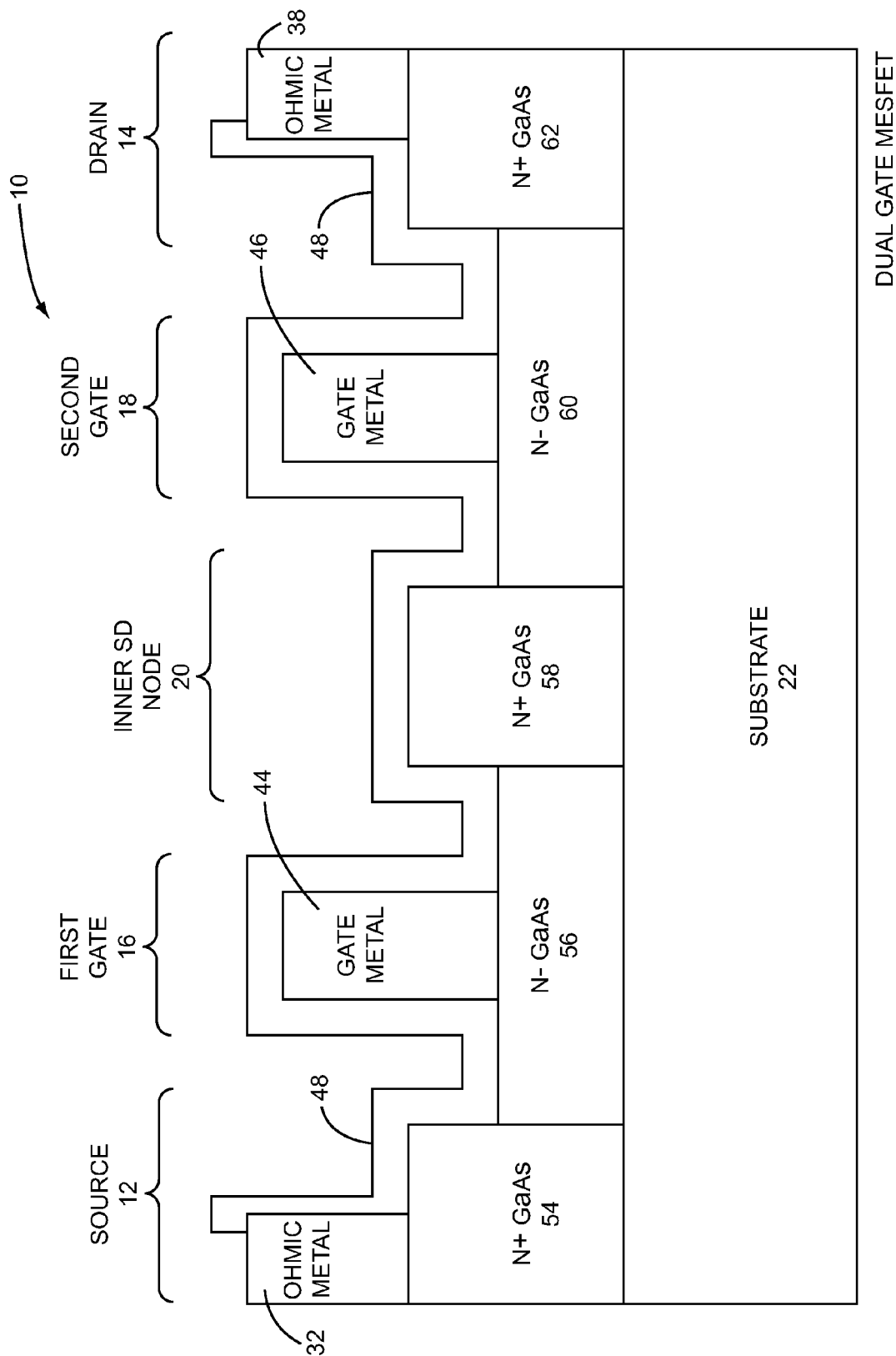
FIG. 6 is a block representation of a metal semiconductor field effect transistor.
Figure 7:
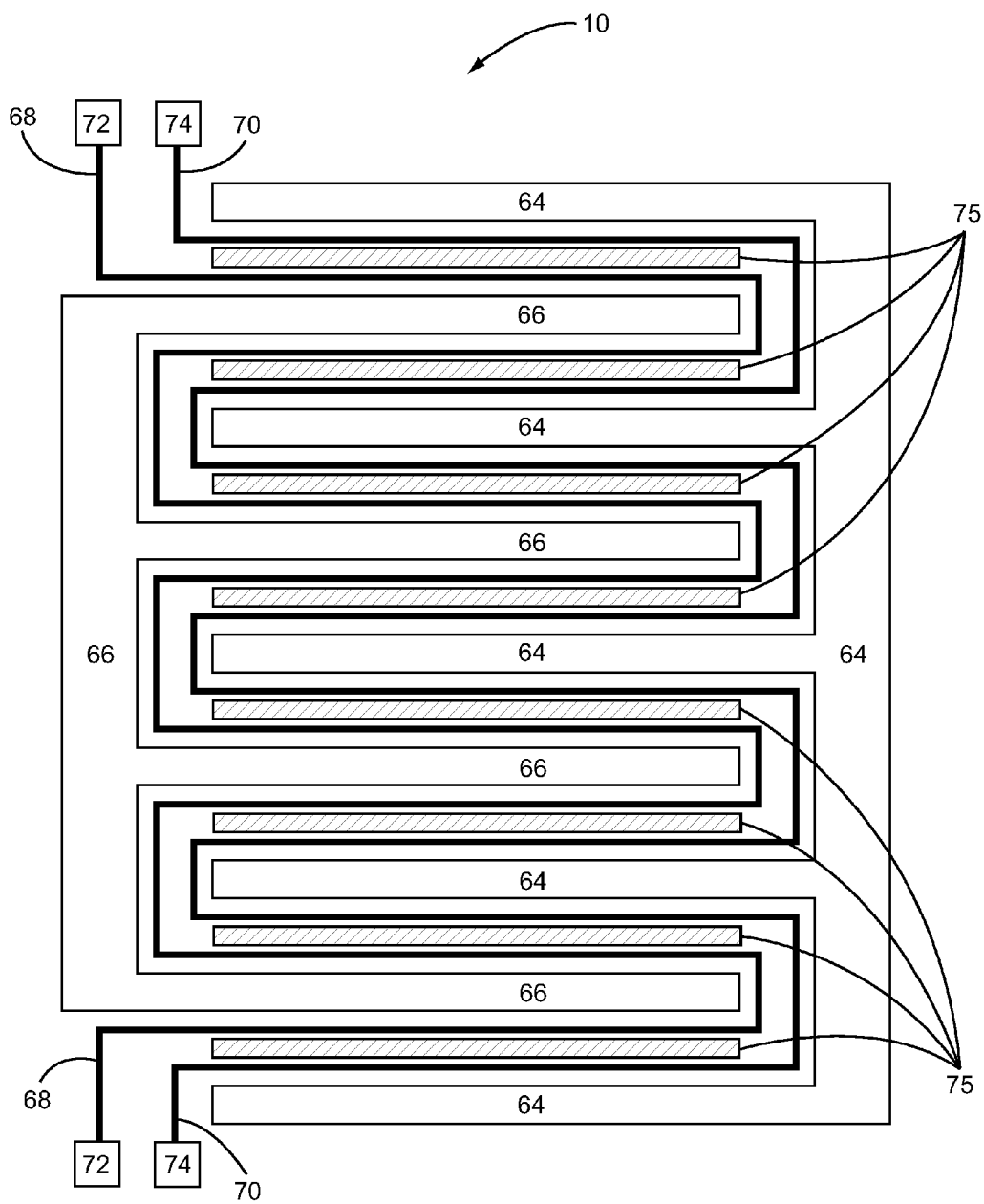
FIG. 7 illustrates a multiple gate transistor architecture having a meandering gate path.
Figure 8A:
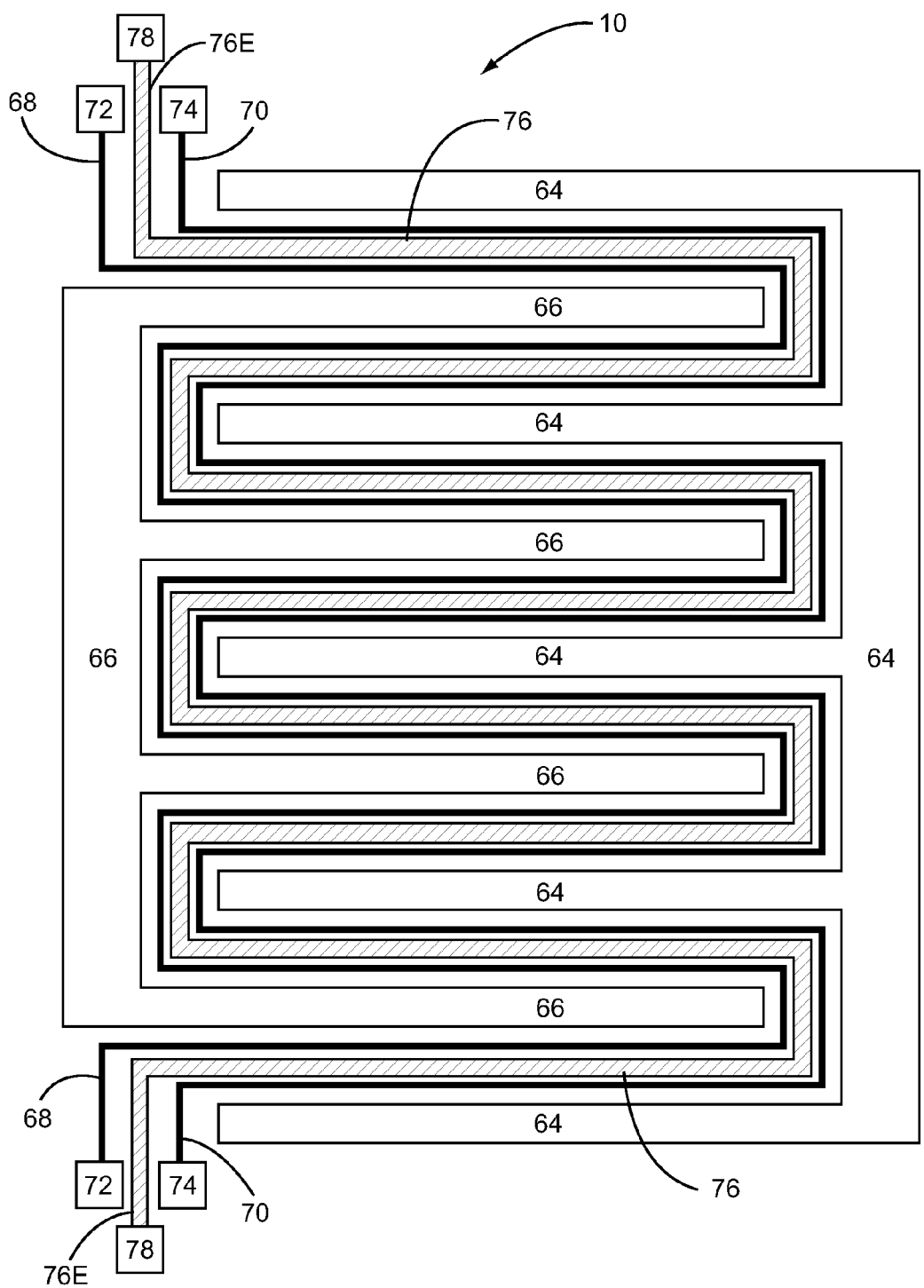
FIG. 8A illustrates a multiple gate transistor architecture having a meandering gate path and an accessible (virtual) source-drain node according to one embodiment of the present invention.

With reference to FIG. 8A, the present invention provides a multiple gate transistor architecture 10 that provides an accessible inner source-drain (SD) node such that a bias or like signal can be supplied to the inner SD node. In particular, the transistor architecture 10 includes a source structure 64 having multiple source fingers, which extend from a source bus, and a drain structure 66 having multiple drain fingers, which extend from a drain bus. The fingers of the fingered source and drain structures 64, 66 are interleaved wherein a meandering path is formed between the fingered source and drain structures 64, 66. Two or more gate structures run substantially parallel to one another along the meandering path between the fingered source and drain structures 64, 66. The transistor architecture 10 that is illustrated is a dual-gate architecture having a first gate structure 68 and a second gate structure 70 that run along the meandering path between the fingered source and drain structures 64, 66. An SD structure is provided between each adjacent pair of gate structures and runs along the meandering path to form the SD node. As illustrated, a continuous meandering SD structure 76 is provided between the first and second gate structures 68, 70. Notably, each SD structure 76 will include or be coupled to one or more SD extensions 76E that is electrically coupled to the SD structure 76 and accessible by other circuitry to allow a bias signal to be applied to the SD node from associated circuitry during operation. Each of the gate, drain, source, and SD structures may be coupled to respective contacts to facilitate electrical connections to the associated circuitry. As illustrated, the first and second gate structures 68, 70 are coupled to first and second gate contacts 72, 74. The meandering SD structure 76 is coupled to SD contacts 78 via the SD extensions 76E.

In the embodiment illustrated in FIG. 8A, the meandering SD structure 76 runs continuously between the two SD contacts 78, wherein the SD extensions 76E are actually extensions of the meandering SD structure 76. However, the SD extensions 76E may be made from another structure or material to facilitate a connection between the SD contacts 78 and the meandering SD structure 76.

Figure 8B:
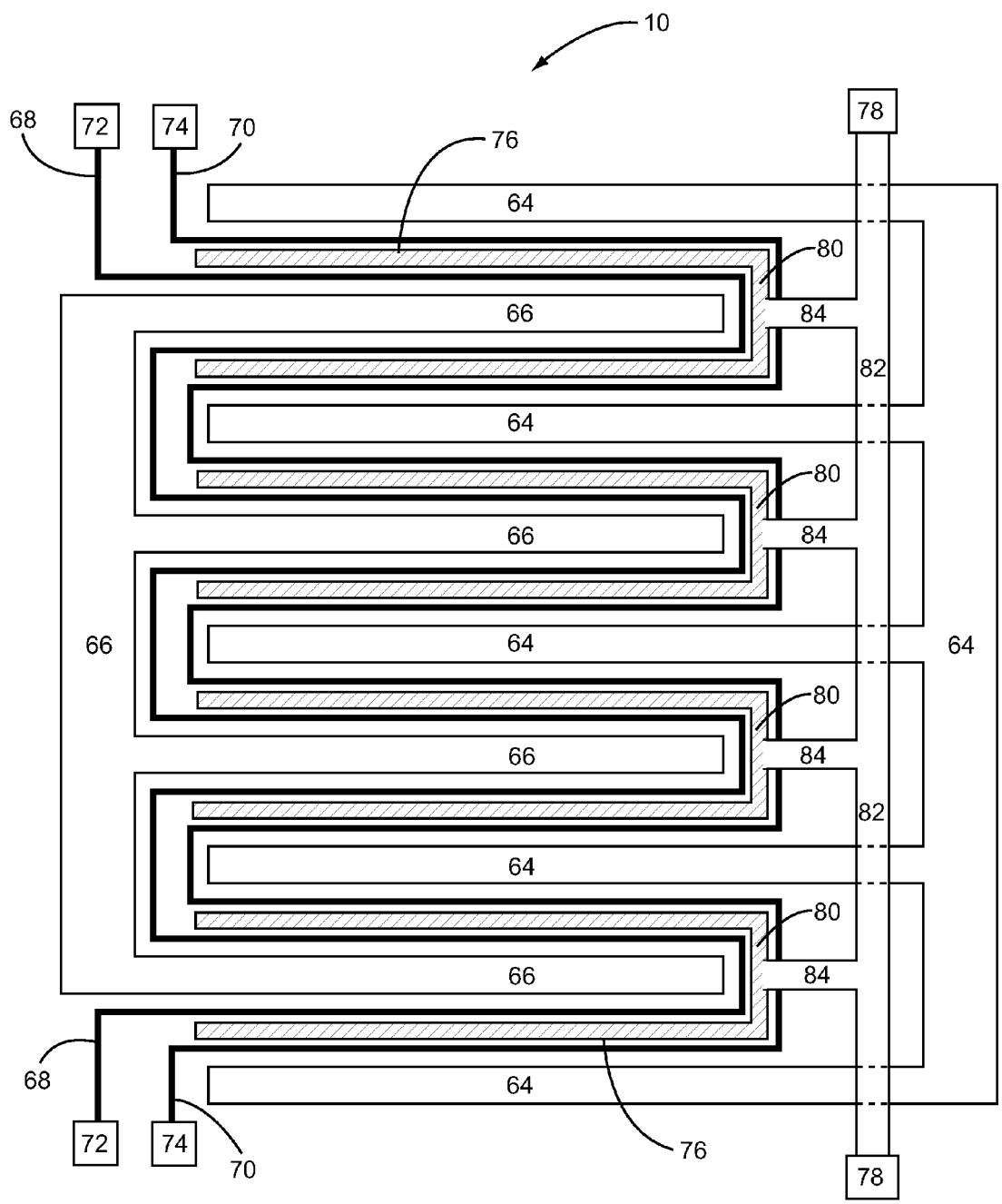
FIG. 8B illustrates a multiple gate transistor architecture having a meandering gate path and an accessible (virtual) source-drain node according to another embodiment of the present invention.

With reference to FIG. 8B, the meandering SD structure 76 is not continuous. Instead, the meandering SD structure 76 is formed from a series of U-shaped SD segments 80. In particular, there is no connection from one SD segment 80 to another within the meandering path on the left side of the figure. Instead, the various SD segments 80 are connected to an SD bus 82 via SD connectors 84. Notably, the SD connectors 84 are isolated from the first and second gate structures 68, 70, and are coupled to the various U-shaped SD segments 80. The SD bus 82 is isolated from the fingered source structure 64, as well as from the fingered drain structure 66 and the first and second gate structures 68, 70. Notably, the SD connectors 84 and the SD bus 82 represent the SD extension or extensions 76E, which are not specifically labeled in FIG. 8B.

Based on these teachings, those skilled in the art will recognize how to configure a continuous or segmented SD structure 76 and provide one or more SD extensions 76E, which provide access to the meandering SD structure 76 by other electronic circuitry. By providing electrical access to the meandering SD structure 76, multiple-gate transistor architectures may be employed in applications requiring the provision of bias or like signals to actual or virtual source-drain nodes.

Figure 9:
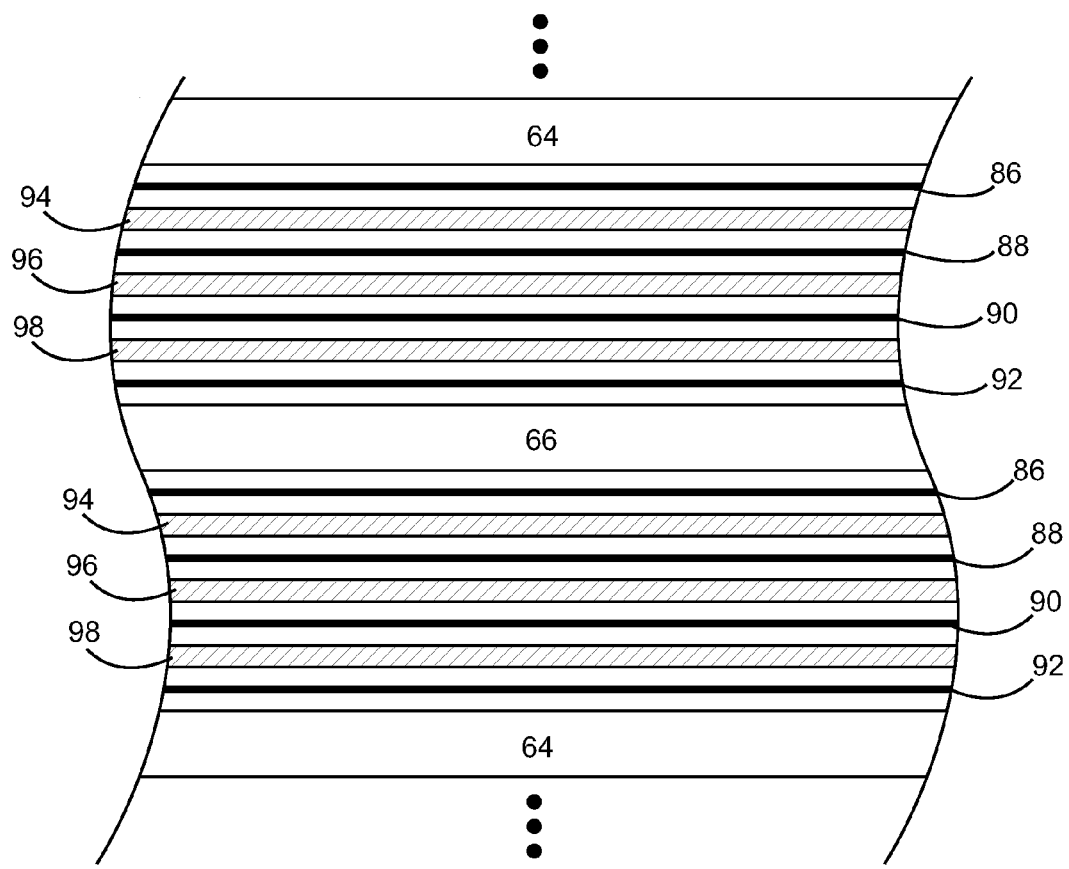
FIG. 9 illustrates a portion of a multiple gate transistor architecture having a four meandering gates and three accessible (virtual) source-drain nodes according to another embodiment of the present invention

Although the above illustrations only show two gate structures, the first and second gate structures 68, 70, any number of gate structures may be provided wherein a meandering SD structure 76 is provided between any or all adjacent pairs of gate structures. With reference to FIG. 9, a portion of a quad-gate transistor architecture is illustrated. In particular, two fingers of a fingered source structure 64 and a single finger of a fingered drain structure 66 are illustrated. Between each adjacent pair of fingers, portions of four meandering gate structures 86, 88, 90, and 92 make up the four gates of the quad-gate transistor architecture. Between each pair of adjacent meandering gate structures 86, 88, 90, 92 reside one of three meandering SD structures 94, 96, 98. Depending on the number of gates required and the extent of biasing required at the actual or virtual source-drain nodes, any number of meandering gate structures and associated meandering SD structures may be provided.

Figure 10:
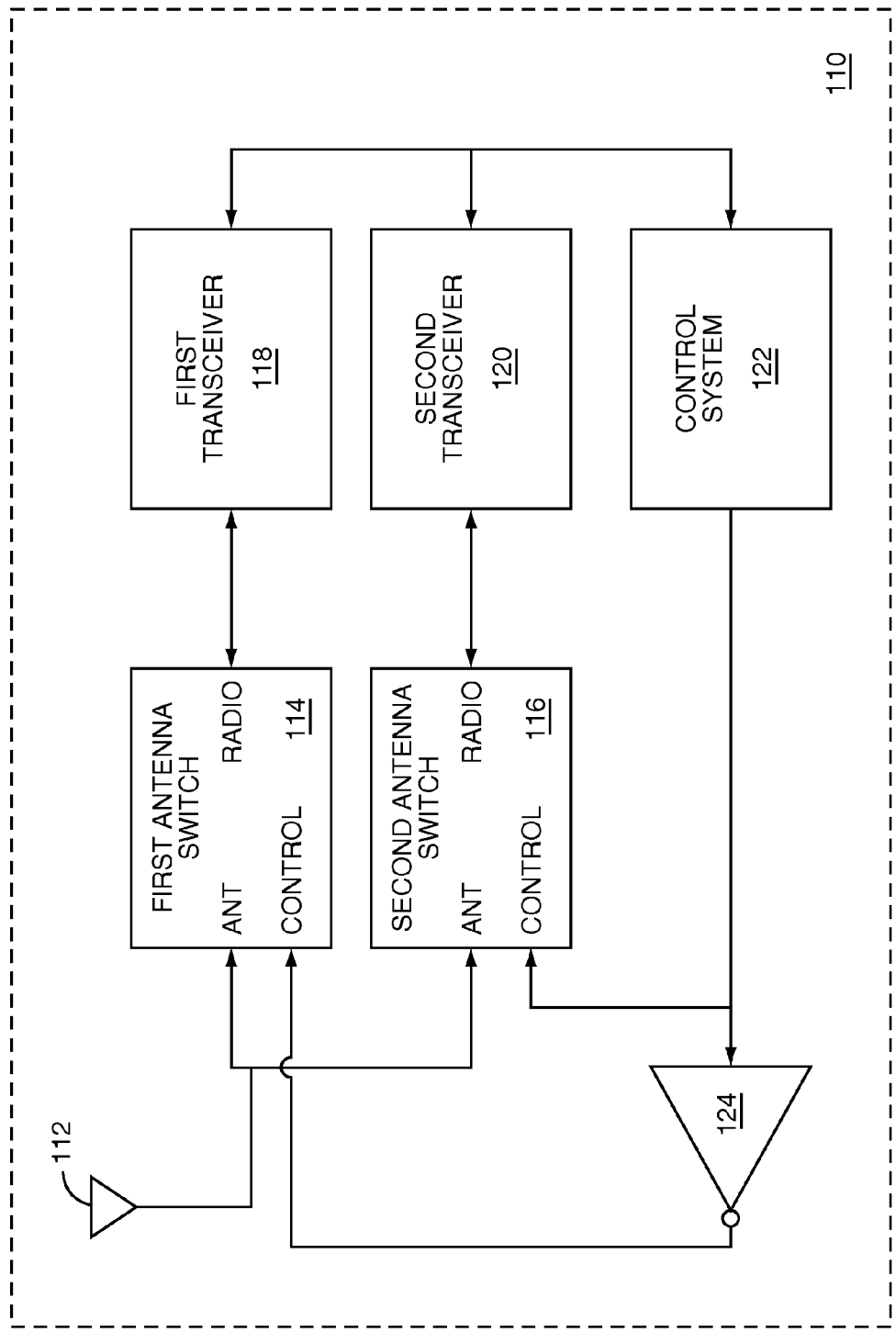
FIG. 10 is dual transceiver communications system with two antenna switches according to the prior art.

With the growth of the wireless communications industry, wireless communications systems have become more sophisticated, and may have to provide support for multiple communications protocols. One example is a system requiring support for both the Wide Band Code Division Multiple Access (WCDMA) and the Global System for Mobile Communications (GSM) communications protocols. These two protocols have significant differences such that two different RF transceivers may be needed. FIG. 10 shows a dual transceiver communications system 110 using a common antenna 112 coupled to antenna connections ANT of a first antenna switch branch 114 and a second antenna switch branch 116. A radio connection RADIO of the first antenna switch branch 114 is coupled to a first transceiver 118, which may provide support for the GSM protocol. A radio connection RADIO of the second antenna switch branch 116 is coupled to a second transceiver 120, which may provide support for the WCDMA protocol. A control system 122 selects either the GSM or the WCDMA protocol by enabling either the first antenna switch branch and transceiver 114, 118 or the second antenna switch branch and transceiver 116, 120. A control input CONTROL of the second antenna switch branch 116 receives a control signal from the control system 122. A control input CONTROL of the first antenna switch branch 114 receives the control signal from the control system 122 through an inverter 124. Therefore, when the first antenna switch branch 114 is enabled, the second antenna switch branch 116 is disabled, and vice versa. The control signal may be low voltage in the range of about 12.5 volts. The antenna switch branches 114, 116 may have similar construction.

When transmitting and receiving using the GSM protocol, the first antenna switch branch 114 is enabled and the second antenna switch branch 116 is disabled. The GSM protocol may support a transmitter output power of about +33 decibel milliwatts (dbm); therefore, the enabled first switch branch 114 must be capable of transferring +33 dbm of power to the antenna 112. The disabled second switch branch 116 must present substantially an open circuit in the presence of +33 dbm signals.

The present invention may be implemented in a wide dynamic range antenna switch that, when disabled, provides a stable input impedance over a wide power range. The following discussion presents numerous configurations for the wide dynamic range antenna switch. For each basic configuration, two versions are presented. The first version is one in which six single gate transistors are coupled in series. The second version is an improved version wherein one or more multiple gate transistors, which employ the accessible SD structure 76 described above, replace the single gate transistors of the first version. Notably, the first versions for each configuration are described in related U.S. patent application Ser. No. 11/532,725, now U.S. Pat. No. 7,459,988, which has been incorporated by reference.

For each configuration, one or more transistors provide a main signal path between an antenna connection and a radio connection. DC bias signals are provided to actual or virtual SD nodes to ensure that when the antenna switch is disabled, the input impedance is stable. A control input, which may operate with low voltage control signals, enables or disables the antenna switch. The antenna switch may be coupled with other antenna switches in a communications system with multiple transceivers sharing a common antenna, and with a wide range of transmitter output power levels. Different embodiments of the present invention provide different DC bias circuit architectures. In certain embodiments, the antenna switch is symmetrical so that the antenna connection and the radio connection are interchangeable.

For the first configuration, FIG. 11A shows a wide dynamic range RF antenna switch 126. A first transistor element 128, a second transistor element 130, a third transistor element 132, a fourth transistor element 134, a fifth transistor element 136, and a sixth transistor element 138 each have two main nodes, which are coupled in series to form the primary signal path for the antenna switch 126. Each transistor element may be a single gate FET, such as a pHEMPT, MOSFET, or MESFET. The first transistor element 128 is coupled to an antenna connection node ANT, and the sixth transistor element 138 is coupled to a radio connection node RADIO. Normally, the antenna connection node ANT may be coupled to an antenna, or other common RF system connection. The radio connection node RADIO may be coupled to radio circuitry, which may include an RF transmitter, receiver, or both. In certain embodiments, the wide dynamic range RF antenna switch 126 is symmetrical, wherein the antenna connection node ANT is interchangeable with the radio connection node RADIO. A first transistor element control network 140, a second transistor element control network 142, a third transistor element control network 144, a fourth transistor element control network 146, a fifth transistor element control network 148, and a sixth transistor element control network 150 are coupled on one side to control inputs of the first, second, third, fourth, fifth, and sixth transistor elements 128, 130, 132, 134, 136, 138, respectively, and are coupled on the other side to a common antenna control node. The common antenna control node is coupled to an antenna switch control input CONTROL, which receives a control signal to enable or disable the wide dynamic range RF antenna switch 126. Any number of transistor elements may be used to form the primary signal path.

Bias circuitry 152 includes an antenna signal input ANTIN, which is coupled to the antenna connection node ANT and receives an antenna input signal from the antenna connection node ANT, and a radio signal input RADIOIN, which is coupled to the radio connection node RADIO and receives a radio input signal from the radio connection node RADIO. The bias circuitry 152 uses the antenna input signal and the radio input signal to provide five bias signals, which are provided on a first bias output B1, which is coupled to an actual source-drain node of the first and second transistor elements 128, 130, a second bias output B2, which is coupled to an actual source-drain node of the second and third transistor elements 130, 132, a third bias output B3, which is coupled to an actual source-drain node of the third and fourth transistor elements 132, 134, a fourth bias output B4, which is coupled to an actual source-drain node of the fourth and fifth transistor elements 134, 136, and a fifth bias output B5, which is coupled to the source-drain node of the fifth and sixth transistor elements 136, 138. If the wide dynamic range RF antenna switch 126 is disabled, five bias signals B1, B2, B3, B4, B5 are provided by dividing differences between the antenna signal input ANTIN and the radio input signal RADIOIN. In an exemplary embodiment, the voltage at the radio connection node RADIO may be approximately 12.5 volts DC, the control signal may be zero volts, and the antenna input signal may be a +20 dbm RF signal with a 12.5 volt DC offset. The difference between the antenna input signal and the signal from the radio connection node RADIO is the +20 dbm RF signal, which is divided equally across the transistor elements 128, 130, 132, 134, 136, 138; however, each of the transistor elements 128, 130, 132, 134, 136, 138 receives 12.5 volts of DC bias, which deliberately disables each of the transistor elements 128, 130, 132, 134, 136, 138.

Turning now to FIG. 11B, if the transistor elements 128, 130, 132, 134, 126, 138 of FIG. 11A are single gate FETs, these transistor elements may be replaced with a six-gate transistor T1' that is configured according to the present invention. The six-gate transistor T1' will include six meandering gates G1', G2', G3', G4', G5', G6' located between a fingered drain structure D' and a fingered source structure S'. Notably, a meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 12A adds an antenna side self-biasing network 154 to the wide dynamic range RF antenna switch 126 of FIG. 11A. The antenna side self-biasing network 154 is coupled between the antenna connection node ANT and the control input to the first transistor element 128. Without the antenna side self-biasing network 154, when the wide dynamic range RF antenna switch 126 is disabled and the antenna input signal is large, threshold voltages of some of the transistor elements 128, 130, 132, 134, 136, 138 closer to the antenna connection node ANT may be exceeded, thereby causing some of the transistor elements 128, 130, 132, 134, 136, 138 to slightly enable and disable causing input impedance variations. These input impedance variations may cause intermodulation distortion of received signals when in the presence of interference signals. The antenna side self-biasing network 154 provides non-symmetrical behavior to the slightly enabling and disabling behavior of some of the transistor elements 128, 130, 132, 134, 136, 138, which extracts a DC component from the antenna input signal, thereby driving the DC bias of some of the transistor elements 128, 130, 132, 134, 136, 138 closer to the radio connection node RADIO deeper in the disabled direction, which provides a stable input impedance. In one embodiment, the antenna input signal may be a +33 dbm RF signal.

Turning now to FIG. 12B, if the transistor elements 128, 130, 132, 134, 126, 138 of FIG. 12A are single gate FETs, these transistor elements may be replaced with a two triple-gate transistors T1' and T2' that are configured according to the present invention. Transistor T1' will include three meandering gates G1', G2', G3' located between a fingered drain structure D1' and a fingered source structure S1'. Notably, a meandering SD structure 76 (not labeled) is located between adjacent ones of the three meandering gates G1', G2', G3'. The two meandering SD nodes 76 and their corresponding SD extensions 76E form accessible virtual SD nodes N1', N2'. These two virtual SD nodes N1', N2' are coupled to bias signals B1, B2.

Transistor T2' will include three meandering gates G4', G5', G6' located between a fingered drain structure D2' and a fingered source structure S2'. Notably, a meandering SD structure 76 (not labeled) is located between adjacent ones of the three meandering gates G4', G5', G6'. The two meandering SD nodes 76 and their corresponding SD extensions 76E form accessible virtual SD nodes N3', N4'. These two virtual SD nodes N3', N4' are coupled to bias signals B4, B5. Bias node B3 is coupled to an actual source-drain node N1, which is formed where the source S1' of transistor T1' and the drain D2' of transistor T2' are connected. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 13A adds a radio side self-biasing network 156 to the wide dynamic range RF antenna switch 126 of FIG. 12A. The radio side self-biasing network 156 is coupled between the radio connection node RADIO and the control input to the sixth transistor element 138. Having self-biasing networks 154, 156 on both sides of the wide dynamic range RF antenna switch 126 provides symmetry and may allow the radio connection node RADIO to be interchangeable with the antenna connection node ANT.

Turning now to FIG. 13B, if the transistor elements 128, 130, 132, 134, 126, 138 of FIG. 13A are single gate FETs, these transistor elements may be replaced with three dual-gate transistors T1', T2', T3' that are configured according to the present invention. Transistor T1' will include two meandering gates G1', G2' located between a fingered drain structure D1' and a fingered source structure S1'. Notably, a meandering SD structure 76 (not labeled) is located between meandering gates G1', G2'. The meandering SD node 76 and its corresponding SD extensions 76E form an accessible virtual SD node N1'. SD node N1' is coupled to bias signal B1.

Transistor T2' will include two meandering gates G3', G4' located between a fingered drain structure D2' and a fingered source structure S2'. Notably, a meandering SD structure 76 (not labeled) is located between meandering gates G3', G4'. The meandering SD node 76 and its corresponding SD extensions 76E form an accessible virtual SD node N2'. The virtual SD node N2' is coupled to bias signal B3.

Transistor T3' will include two meandering gates G5', G6' located between a fingered drain structure D3' and a fingered source structure S3'. Notably, a meandering SD structure 76 (not labeled) is located between meandering gates G5', G6'. The meandering SD node 76 and its corresponding SD extensions 76E form an accessible virtual SD node N3'. The virtual SD node N3' is coupled to bias signal B5.

Bias node B2 is coupled to an actual source-drain node N1, which is formed where the source S1' of transistor T1' and the drain D2' of transistor T2' are connected. Bias node B4 is coupled to an actual source-drain node N2, which is formed where the source S2' of transistor T2' and the drain D3' of transistor T3' are connected. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 14A adds a common control network 158 to the wide dynamic range RF antenna switch 126 of FIG. 13A. The common control network 158 is coupled between the common antenna control node and the antenna switch control input CONTROL. The common control network 158 may provide some isolation between the transistor elements 128, 130, 132, 134, 136, 138 and the antenna switch control input CONTROL.

Turning now to FIG. 14B, if the transistor elements 128, 130, 132, 134, 126, 138 of FIG. 14A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 15A shows one configuration of the wide dynamic range RF antenna switch 126 of FIG. 14A. The transistor element control networks 140, 142, 144, 146, 148, 150, and the common control network 158 may include resistive elements. The self-biasing networks 154, 156 may include capacitive elements.

Turning now to FIG. 15B, if the transistor elements 128, 130, 132, 134, 126, 138 of FIG. 15A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 16A shows an embodiment wherein the bias circuitry 152 includes a first bias network 160, a second bias network 162, a first bias circuit 164, a third bias network 166, a fourth bias network 168, a fifth bias network 170, and a sixth bias network 172. The first bias network 160 is coupled between the antenna connection node ANT and the second bias network 162, which is coupled to the radio connection node RADIO to create a divided antenna signal. The first bias circuit 164 is coupled to the first and second bias networks 160, 162 to receive the divided antenna signal. The first bias circuit 164 conditions the divided antenna signal, which is then provided to the third, fourth, fifth, and sixth bias networks 166, 168, 170, 172. The third, fourth, fifth, and sixth bias networks 166, 168, 170, 172 are coupled to and provide bias signals to the transistor elements 128, 130, 132, 134, 136, 138. In one embodiment, the first bias circuit 164 is substantially a short circuit. In another embodiment, the first bias circuit 164 may include a resistive element. The value of the resistive element may be low enough to effectively provide DC biasing from the divided antenna signal in the presence of small input signals, but high enough to not degrade self-biasing in the presence of large input signals.

Turning now to FIG. 16B, if the transistor elements 128, 130, 132, 134, 126, 138 of FIG. 16A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 17A shows a first embodiment of the wide dynamic range RF antenna switch 126 of FIG. 16A. The first and second bias networks 160, 162, and the first bias circuit 164 may include resistive elements. Turning now to FIG. 17B, if the transistor elements 128, 130, 132, 134, 126, 138 of FIG. 17A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 18A shows a second embodiment wherein the first bias circuit 164 of FIG. 16A includes a diode element. The diode element provides DC biasing from the divided antenna signal in the presence of small input signals, but may become reversed biased to not degrade self-biasing in the presence of large input signals. The anode of the diode element is coupled to the first and second bias networks 160, 162. The cathode of the diode element is coupled to the third, fourth, fifth, and sixth bias networks 166, 168, 170, 172.

Turning now to FIG. 18B, if the transistor elements 128, 130, 132, 134, 126, 138 of FIG. 18A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 19A adds a first RF bypass network 174 to the second embodiment of the present invention shown in FIG. 18A. The first RF bypass network 174 is coupled across the first bias circuit 164 to bypass any RF signals that may develop across the first bias circuit 164.

Turning now to FIG. 19B, if the transistor elements 128, 130, 132, 134, 126, 138 of FIG. 19A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 20A shows another configuration of the embodiment shown in FIG. 19A. The first RF bypass network 174 may include a capacitive element. Turning now to FIG. 20B, if the transistor elements 128, 130, 132, 134, 126, 138 of FIG. 20A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 21A shows an exemplary embodiment wherein the first bias circuit 164 of FIG. 16A includes a bias switching transistor element and a bias switching transistor control network 176. The bias switching transistor control network 176 is coupled between a bias mode input MODE and a control input to the bias switching transistor element. The bias mode input MODE receives a bias mode control signal, which enables or disables the bias switching transistor element. When enabled, as in the presence of small input signals, the bias switching transistor element provides DC biasing to the third, fourth, fifth, and sixth bias networks 166, 168, 170, 172. When disabled, as in the presence of large input signals, the bias switching transistor element presents substantially an open circuit to the third, fourth, fifth, and sixth bias networks 166, 168, 170, 172, which does not interfere with self-biasing.

Turning now to FIG. 21B, if the transistor elements 128, 130, 132, 134, 126, 138 of FIG. 21A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 22A adds the first RF bypass network 174 to the embodiment shown in FIG. 21A to bypass any RF signals that may develop across the first bias circuit 164. Turning now to FIG. 22B, if the transistor elements 128, 130, 132, 134, 126, 138 of FIG. 22A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 23A adds a second RF bypass network 178 and a third RF bypass network 180 to embodiment shown in FIG. 22A to bypass any RF signals at the control input to the bias switching transistor element. The second and third RF bypass networks 178, 180 are coupled in series across the bias switching transistor element. The series coupled connection of the second and third RF bypass networks 178, 180 are coupled to the control input to the bias switching transistor element 164.

Turning now to FIG. 23A, if the transistor elements 128, 130, 132, 134, 126, 138 of FIG. 23A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 24A shows one configuration of the embodiment shown in FIG. 23A. The first, second, and third RF bypass networks 174, 178, 180 may include capacitive elements. The bias switching transistor control network 176 may include a resistive element. Turning now to FIG. 14B, if the transistor elements 128, 130, 132, 134, 126, 138 of FIG. 14A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 25A shows another embodiment wherein the first bias circuit 164 of FIG. 16A includes a current source, and a current source control network 182. The current source control network 182 is coupled to the current source to provide a current setpoint. The current source provides DC biasing to the third, fourth, fifth, and sixth bias networks 166, 168, 170, 172, and since the output impedance of a current source is large, the current source does not interfere with self-biasing.

Turning now to FIG. 25B, if the transistor elements 128, 130, 132, 134, 126, 138 of FIG. 14A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 26A adds the first RF bypass network 174 to the embodiment shown in FIG. 16A. Turning now to FIG. 26B, if the transistor elements 128, 130, 132, 134, 126, 138 of FIG. 14A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

FIG. 27A shows another configuration of embodiment of FIG. 26A. The current source may include a current source transistor element. The current source control network 182 may include a resistive element. The first RF bypass network 174 may include a capacitive element. Turning now to FIG. 27B, if the transistor elements 128, 130, 132, 134, 126, 138 of FIG. 14A are single gate FETs, these transistor elements may be replaced with the six-gate transistor T1' that is configured according to the present invention. The six-gate transistor T1' will include six meandering gates G1', G2', G3', G4', G5', G6' located between a fingered drain structure D' and a fingered source structure S'. The meandering SD structure 76 (not labeled) is located between adjacent ones of the six meandering gates G1', G2', G3', G4', G5', G6'. The five meandering SD nodes 76 and their corresponding SD extensions 76E form accessible virtual SD nodes N1', N2', N3', N4', N5'. These virtual SD nodes N1', N2', N3', N4', N5' are coupled to the five bias signals B1, B2, B3, B4, B5. The six meandering gates G1', G2', G3', G4', G5', G6' are respectively coupled to the first transistor element control network 140, the second transistor element control network 142, the third transistor element control network 144, the fourth transistor element control network 146, the fifth transistor element control network 148, and the sixth transistor element control network 150.

An application example of a wide dynamic range RF antenna switch 126 is its use in duplexer or switch circuitry 184 in a mobile terminal 186. The basic architecture of the mobile terminal 186 is represented in FIG. 28 and may include a receiver front end 188, a radio frequency transmitter section 190, an antenna 192, the duplexer or switch circuitry 184, a baseband processor 194, a control system 196, a frequency synthesizer 198, and an interface 200. The receiver front end 188 receives information bearing radio frequency signals from one or more remote transmitters provided by a base station. A low noise amplifier (LNA) 202 amplifies the signal. A filter circuit 204 minimizes broadband interference in the received signal, while downconversion and digitization circuitry 206 downconverts the filtered, received signal to an intermediate or baseband frequency signal, which is then digitized into one or more digital streams. The receiver front end 188 typically uses one or more mixing frequencies generated by the frequency synthesizer 198. The baseband processor 194 processes the digitized received signal to extract the information or data bits conveyed in the received signal. This processing typically comprises demodulation, decoding, and error correction operations. As such, the baseband processor 194 is generally implemented in one or more digital signal processors (DSPs).

On the transmit side, the baseband processor 194 receives digitized data, which may represent voice, data, or control information, from the control system 196, which it encodes for transmission. The encoded data is output to the transmitter 190, where it is used by a modulator 208 to modulate a carrier signal that is at a desired transmit frequency. Power amplifier circuitry 210 amplifies the modulated carrier signal to a level appropriate for transmission, and delivers the amplified and modulated carrier signal to the antenna 192 through the duplexer or switch circuitry 184.

A user may interact with the mobile terminal 186 via the interface 210, which may include interface circuitry 212 associated with a microphone 214, a speaker 216, a keypad 218, and a display 220. The interface circuitry 212 typically includes analog-to-digital converters, digital-to-analog converters, amplifiers, and the like. Additionally, it may include a voice encoder/decoder, in which case it may communicate directly with the baseband processor 194. The microphone 214 will typically convert audio input, such as the user's voice, into an electrical signal, which is then digitized and passed directly or indirectly to the baseband processor 194. Audio information encoded in the received signal is recovered by the baseband processor 194, and converted by the interface circuitry 212 into an analog signal suitable for driving the speaker 216. The keypad 218 and display 220 enable the user to interact with the mobile terminal 186, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A transistor circuit comprising:
a first multiple gate transistor comprising:
a source structure having a plurality of source fingers extending from a source bus;
a drain structure having plurality of drain fingers extending from a drain bus and interleaved with the plurality of source fingers wherein a meandering path is formed between the source and drain structures;
a plurality of gate structures that are substantially parallel with one another and extend along the meandering path between the source and drain structures, wherein at least one of the plurality of gate structures extends continuously along the meandering path;

a source-drain structure that extends along the meandering path between adjacent ones of the plurality of gate structures to form a source-drain node; and
a source-drain extension that is electrically connected to the source-drain structure and externally accessible; and
control circuitry adapted to provide control signals to corresponding one of the plurality of gate structures and to provide the source drain node via the source drain extension.

2. The transistor circuit of claim 1 further comprising a plurality of multiple gate transistors that are connected in series and include the first multiple gate transistor, wherein the control circuitry is further adapted to provide signals to source-drain structures of the plurality of multiple gate transistors is further adapted to provide control signals to gate structures of the plurality of multiple gate transistors.

3. The transistor circuit of claim 2 wherein at least one actual source-drain node is formed where any two of the plurality of multiple gate transistors are connected in series and the control circuitry is further adapted to provide a signal to the at least one actual source-drain node.

4. The transistor circuit of claim 2 wherein a source structure on a first end of the plurality of multiple gate transistors forms a first port and a drain structure on a second end of the plurality of multiple gate transistors forms a second port.

5. The transistor circuit of claim 4 wherein the first port is coupled to an antenna and the second port is coupled to at least one of a group consisting of transmitter circuitry and receiver circuitry.

6. The transistor circuit of claim 1 wherein the source structure and the drain structure are coupled between an antenna and one of a group consisting of transmitter and receiver circuitry to form an antenna switch.

7. The transistor circuit of claim 1 wherein the control circuitry is adapted to provide the control signals to disable and enable the transistor circuit, and the control circuitry is adapted to provide the signal as a DC bias signal configured to bias the first multiple gate transistor to maintain a stable input impedance for the transistor circuit.

8. The transistor circuit of claim 1 wherein the source-drain structure is continuous along a significant majority of the meandering path between the adjacent ones of the plurality of gate structures.

9. The transistor circuit of claim 1 wherein the source-drain structure is formed from a plurality of source-drain segments that are serially aligned along a significant majority of the meandering path between the adjacent ones of the plurality of gate structures, and the source-drain extension is electrically coupled to each of the plurality of source-drain segments.

10. The transistor circuit of claim 1 wherein the plurality of gate structures comprises N gate structures, there are N−1 source-drain structures such that each of the N−1 source-drain structures is provided between an adjacent pair of the N gate structures, and N is an integer greater than 2.

11. The transistor circuit of claim 1 wherein the source structure, the drain structure, and the plurality of gate structures form a multiple gate field effect transistor (FET).

12. A multiple gate transistor comprising:
a source structure having a plurality of source fingers extending from a source bus;
a drain structure having plurality of drain fingers extending from a drain bus and interleaved with the plurality of source fingers wherein a meandering path is formed between the source and drain structures,
a plurality of gate structures that are substantially parallel with one another and extend along the meandering path between the source and drain structures;
a source-drain structure that extends along the meandering path between adjacent ones of the plurality of gate structures to form a source-drain node; and
a source-drain extension that is electrically connected to the source-drain structure and externally accessible to facilitate electrical connections to associated circuitry, wherein at least one signal from the associated circuitry is applied to the source-drain node via the source-drain extension, wherein at least one of the plurality of gate structures extends continuously along the meandering path;
wherein the source-drain structure is formed from a plurality of source-drain segments that are serially aligned along a significant majority of the meandering path between the adjacent ones of the plurality of gate structures, and the source-drain extension is electrically coupled to each of the plurality of source-drain segments.

13. The transistor circuit of claim 1 wherein the source-drain extension is externally accessible so as to facilitate electrical connections to associated circuitry, wherein at least one signal from the associated circuitry is applied to the source-drain node via the source-drain extension.

14. The transistor circuit of claim 1 wherein the at least one of the plurality of gate structures extends continuously along the meandering path comprises more than one of the plurality of gate structures extending continuously along the meandering path.

15. The transistor circuit of claim 14 wherein the more than one of the plurality of gate structures extending continuously along the meandering path comprises all of the plurality of gate structures extending continuously along the meandering path.

16. The multiple gate transistor of claim 12 wherein the at least one of the plurality of gate structures extends continuously along the meandering path comprises more than one of the plurality of gate structures extending continuously along the meandering path.

17. The multiple gate transistor of claim 16 wherein the more than one of the plurality of gate structures extending continuously along the meandering path comprises all of the plurality of gate structures extending continuously along the meandering path.

* * * * *